US008350786B2

(12) United States Patent
Yamashita et al.

(10) Patent No.: US 8,350,786 B2
(45) Date of Patent: Jan. 8, 2013

(54) DISPLAY APPARATUS AND METHOD OF DRIVING THE SAME

(75) Inventors: Junichi Yamashita, Tokyo (JP); Takao Tanikame, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 442 days.

(21) Appl. No.: 12/656,424

(22) Filed: Jan. 29, 2010

(65) Prior Publication Data
US 2010/0231568 A1   Sep. 16, 2010

(30) Foreign Application Priority Data
Mar. 12, 2009   (JP) ................. 2009-059326

(51) Int. Cl.
*G09G 3/30* (2006.01)
(52) U.S. Cl. ........................... 345/76; 345/211
(58) Field of Classification Search .............. 345/76, 345/77, 211
See application file for complete search history.

(56) References Cited

U.S. PATENT DOCUMENTS

| | | | |
|---|---|---|---|
| 7,173,590 B2 * | 2/2007 | Uchino et al. | 345/92 |
| 2002/0140659 A1 * | 10/2002 | Mikami et al. | 345/90 |
| 2006/0170628 A1 * | 8/2006 | Yamashita et al. | 345/76 |
| 2007/0115225 A1 * | 5/2007 | Uchino et al. | 345/76 |
| 2007/0268210 A1 | 11/2007 | Uchino et al. | |
| 2008/0001545 A1 | 1/2008 | Uchino et al. | |

FOREIGN PATENT DOCUMENTS

| | | |
|---|---|---|
| JP | 2007-108381 A | 4/2007 |
| JP | 2007-310311 | 11/2007 |
| JP | 2008-009198 | 1/2008 |
| JP | 2008-191296 A | 8/2008 |
| JP | 2008-256916 A | 10/2008 |
| JP | 2009-008872 A | 1/2009 |
| JP | 2009-008873 A | 1/2009 |
| JP | 2009-008874 A | 1/2009 |
| JP | 2009-069322 A | 4/2009 |
| JP | 2009-157018 A | 7/2009 |
| JP | 2009-204992 A | 9/2009 |
| JP | 2009-294635 A | 12/2009 |
| JP | 2010-038928 A | 2/2010 |
| JP | 2010-091720 A | 4/2010 |

OTHER PUBLICATIONS

Japanese Office Action issued Apr. 5, 2011 for corresponding Japanese Application No. 2009-059326.

* cited by examiner

*Primary Examiner* — Amare Mengistu
*Assistant Examiner* — Koosha Sharifi-Tafreshi
(74) *Attorney, Agent, or Firm* — Rader Fishman & Grauer, PLLC

(57) ABSTRACT

Driving a display apparatus by performing write processing for applying an auxiliary video signal to a corresponding data line, then, applying a video signal, instead of the auxiliary video signal, to the corresponding data line, and in a state where a predetermined drive voltage is applied from a power supply portion to one area of the source and drain areas of a drive transistor, applying a voltage based on the auxiliary video signal and a voltage based on the video signal from the corresponding data line to the gate electrode of the drive transistor through a write transistor which is turned on in response to a scanning signal from the corresponding scanning line.

16 Claims, 16 Drawing Sheets

[FIRST EMBODIMENT]

[FIRST EMBODIMENT(REFERENCE EXAMPLE)]
FIG.6A [TP(2)₀]
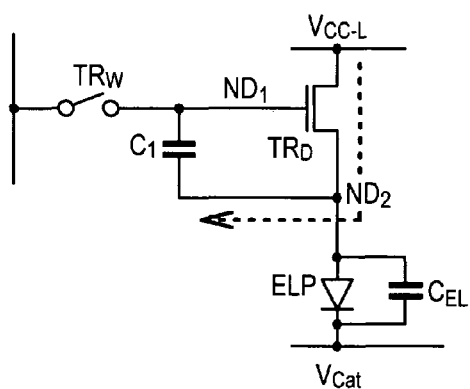
FIG.6B [TP(2)₁]
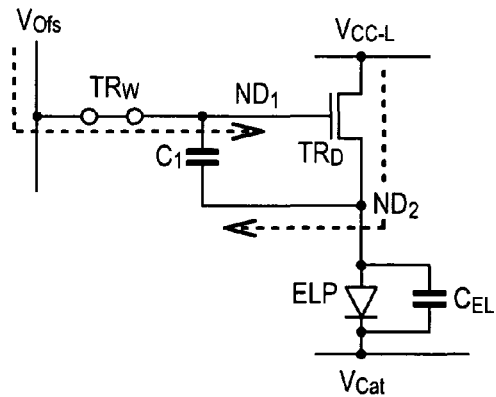
FIG.6C [TP(2)₂]
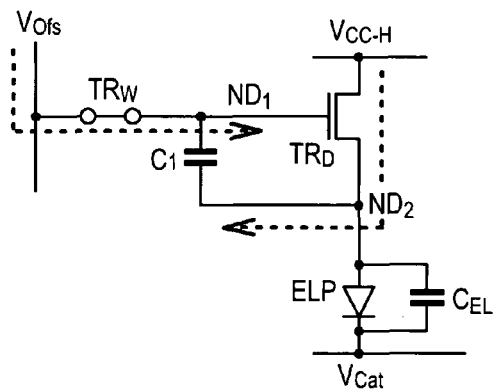
FIG.6D [TP(2)₃]
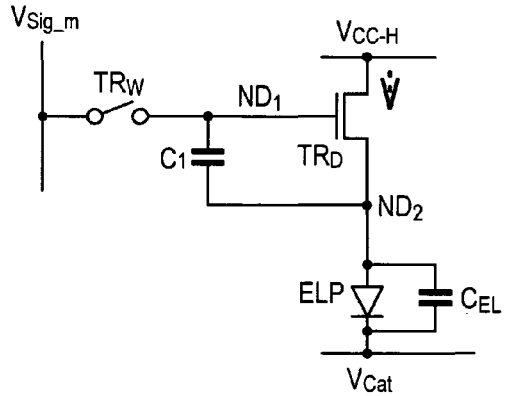
FIG.6E [TP(2)₄]
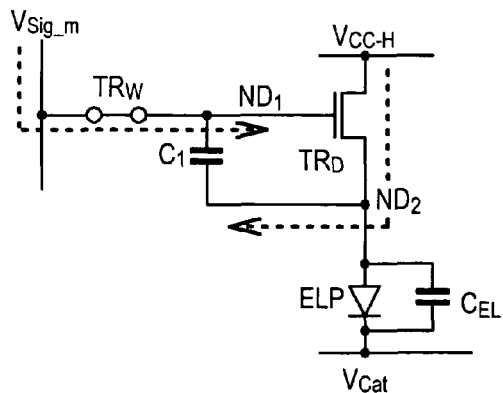
FIG.6F [TP(2)₅]
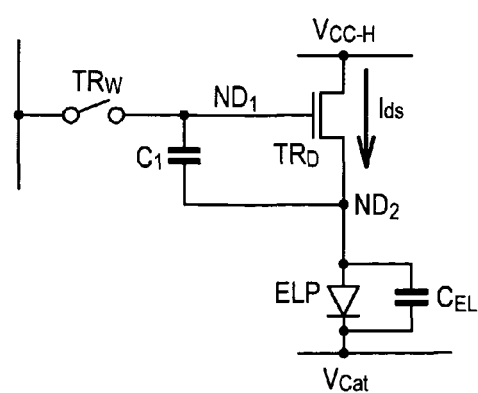

[FIRST EMBODIMENT]

[FIRST EMBODIMENT(REFERENCE EXAMPLE)]

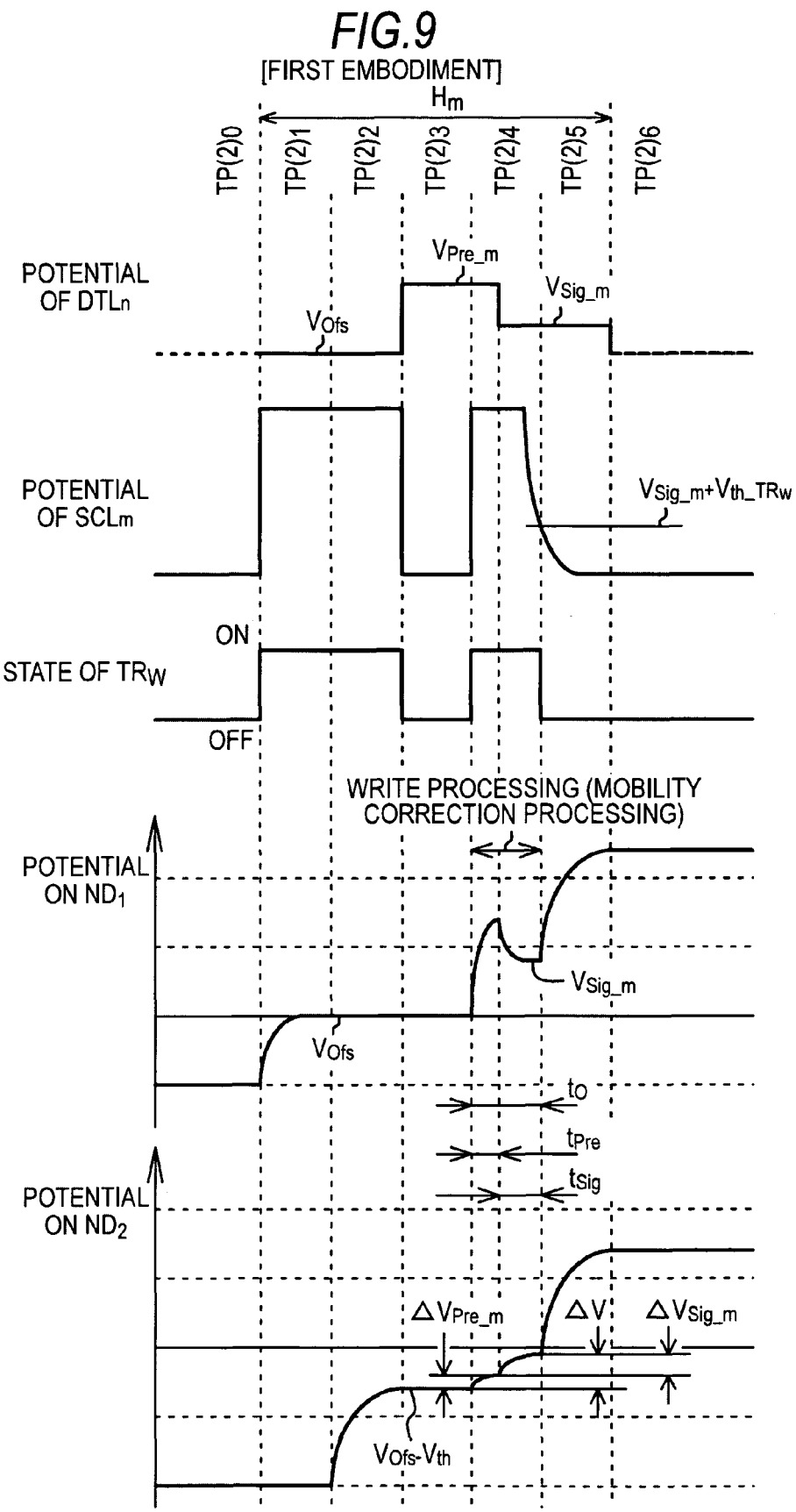

[FIRST EMBODIMENT]
FIG. 10A [TP(2)₄]
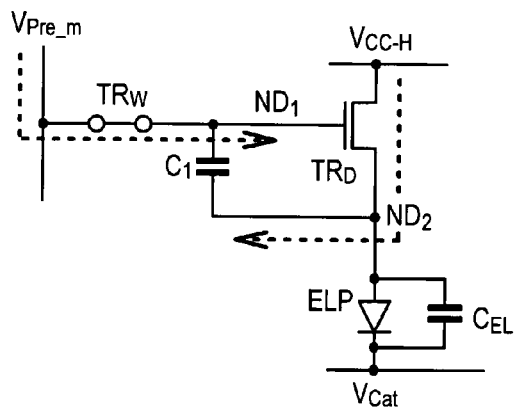
FIG. 10B [TP(2)₄] (CONTINUED)
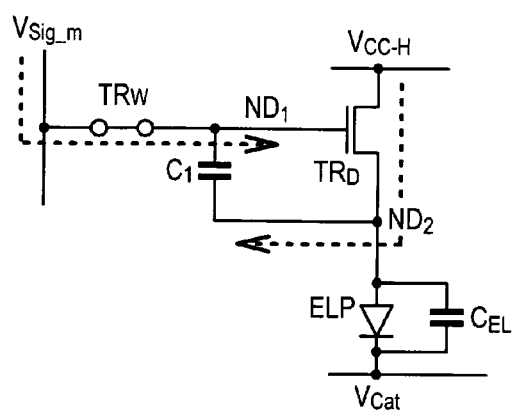
FIG. 10C
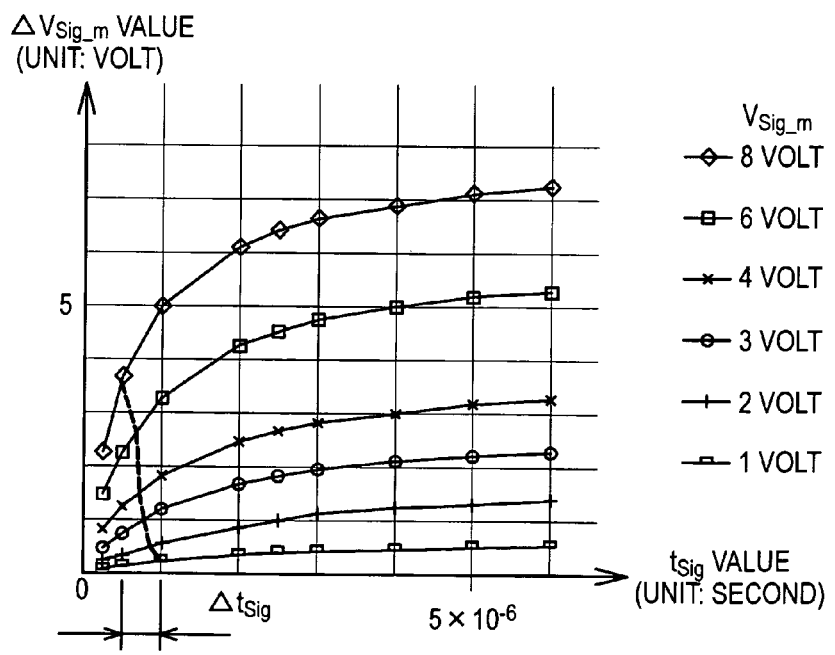

FIG.11
[FIRST EMBODIMENT]

DISPLAY APPARATUS AND METHOD OF DRIVING THE SAME

BACKGROUND OF THE INVENTION

1. Field of the Invention

The present invention relates to a display apparatus and a method of driving a display apparatus.

2. Description of the Related Art

There are a display device including a current-driven light-emitting portion and a display device including the relevant display device. For example, a display apparatus (hereinafter, simply referred to as organic EL display device) including an organic electroluminescence light-emitting portion using electroluminescence (hereinafter, simply referred to as EL) of an organic material is attracting attention as a display device capable of achieving high-luminance light-emission by low-voltage direct-current driving.

Similarly to a liquid crystal display, for example, a display apparatus including an organic EL display device (hereinafter, simply referred to as organic EL display) uses a simple matrix system and an active matrix system as a drive system. The active matrix system has a complex structure but obtains an image with high luminance. An organic EL display device which is driven by the active matrix system includes a light-emitting portion having an organic layer and the like including a light-emitting layer, and a drive circuit for driving the light-emitting portion.

As a circuit for driving an organic electroluminescence light-emitting portion (hereinafter, simply referred to as light-emitting portion), a drive circuit (referred to as 2Tr/1C drive circuit) including two transistors and one capacitor portion is described in JP-A-2007-310311. As shown in FIG. 2, the 2Tr/1C drive circuit includes two transistors of a write transistor $TR_W$ and a drive transistor $TR_D$, and one capacitor portion $C_1$. The other area of the source and drain areas of the drive transistor $TR_D$ forms a second node $ND_2$, and the gate electrode of the drive transistor $TR_D$ forms a first node $ND_1$.

As shown in a timing chart of FIG. 5, during [period-TP$(2)_1$], preprocessing for performing threshold voltage cancel processing is executed. That is, a first node initialization voltage $V_{Ofs}$ (for example, 0 V) is applied from a data line DTL to the first node $ND_1$ through the write transistor $TR_W$, which is turned on in response to a scanning signal from a scanning line SCL. Thus, the potential on the first node $ND_1$ becomes $V_{Ofs}$. Further, a second node initialization voltage $V_{CC-L}$ (for example, −10 V) is applied from a power supply portion 100 to the second node $ND_2$ through the drive transistor $TR_D$. Thus, the potential on the second node $ND_2$ becomes $V_{CC-L}$. The threshold voltage of the drive transistor $TR_D$ is represented as a voltage $V_{th}$ (for example, 3 V). A difference in potential between the gate electrode and the other area of the source and drain areas (hereinafter, referred to as source area for convenience) of the drive transistor $TR_D$ becomes equal to or higher than $V_{th}$, so the drive transistor $TR_D$ is turned on.

Next, during [period-TP$(2)_2$], the threshold voltage cancel processing is performed. That is, in a state where the write transistor $TR_W$ is still turned on, the voltage of the power supply portion 100 is changed from the second node initialization voltage $V_{CC-L}$ to a drive voltage $V_{CC-H}$ (for example, 20 V). As a result, the potential on the second node $ND_2$ changes toward a potential obtained by subtracting the threshold voltage $V_{th}$ of the drive transistor $TR_D$ from the potential on the first node $ND_1$. That is, the potential on the second node $ND_2$ in a floating state increases. Then, if the difference in potential between the gate electrode and the source area of the drive transistor $TR_D$ reaches $V_{th}$, the drive transistor $TR_D$ is turned off. In this state, the potential on the second node $ND_2$ is roughly ($V_{Ofs}-V_{th}$).

Thereafter, during [period-TP$(2)_3$], the write transistor $TR_W$ is turned off. Then, the voltage of the data line DTL is set as a voltage corresponding to a video signal [a video signal (drive signal, luminance signal) $V_{Sig\_m}$ for controlling luminance of the light-emitting portion ELP].

Next, during [period-TP$(2)_4$], write processing is performed. Specifically, the scanning line SCL is at high level, so the write transistor $TR_W$ is turned on. As a result, the potential on the first node $ND_1$ increases to the video signal $V_{Sig\_m}$.

Let the value of the capacitor portion $C_1$ be $c_1$, and the value of the capacitance $C_{EL}$ of the light-emitting portion ELP be $c_{EL}$. Let the value of parasitic capacitance between the gate electrode and the other area of the source and drain areas of the drive transistor $TR_D$ be $c_{gs}$. When the potential of the gate electrode of the drive transistor $TR_D$ is changed from $V_{Ofs}$ to $V_{Sig\_m}$ ($>V_{Ofs}$), the potential between both ends of the capacitor portion $C_1$ (in other words, the potential between the first node $ND_1$ and the second node $ND_2$) changes in principle. That is, electric charges based on the change amount ($V_{Sig\_m}-V_{Ofs}$) of the potential on the gate electrode of the drive transistor $TR_D$ (=the potential on the first node $ND_1$) are distributed to the capacitor portion $C_1$, the capacitance $C_{EL}$ of the light-emitting portion ELP, and parasitic capacitance between the gate electrode and the other area of the source and drain areas of the drive transistor $TR_D$. If the value $c_{EL}$ is sufficiently larger than the value $c_1$ and the value $c_{gs}$, there is small change in the potential on the other area of the source and drain areas of the drive transistor $TR_D$ (second node $ND_2$) based on the change amount ($V_{Sig\_m}-V_{Ofs}$) of the potential on the gate electrode of the drive transistor $TR_D$ is small. In general, the value $c_{EL}$ of the capacitance $C_{EL}$ of the light-emitting portion ELP is larger than the value $c_1$ of the capacitor portion $C_1$ and the value $c_{gs}$ of parasitic capacitance of the drive transistor $TR_D$. Therefore, for convenience of description, description will be provided without taking into consideration the change in the potential on the second bode $ND_2$ due to the change in the potential on the first node $ND_1$. The drive timing chart shown in FIG. 5 is provided without taking into consideration the change in the potential on the second node $ND_2$ due to the change in the potential on the first node $ND_1$.

In the above-described operation, in a state where a voltage $V_{CC-H}$ is applied from the power supply portion 100 to one area of the source and drain areas of the drive transistor $TR_D$, the video signal $V_{Sig\_m}$ is applied to the gate electrode of the drive transistor $TR_D$. For this reason, as shown in FIG. 5, during [period-TP$(2)_4$], the potential on the second node $ND_2$ increases. The increased amount $\Delta V$ of the potential (potential correction value) will be described below. When the potential of the gate electrode of the drive transistor $TR_D$ (first node $ND_1$) is $V_g$, and the potential of the other area of the source and drain areas (second node $ND_2$) is $V_s$, if the increased amount $\Delta V$ of the potential on the second node $ND_2$ is taken into consideration, the value $V_g$ and the value $V_s$ are as follows. The difference in potential between the first node $ND_1$ and the second node $ND_2$, that is, the potential difference $V_{gs}$ between the gate electrode and the other area of the source and drain areas serving as a source area of the drive transistor $TR_D$ can be expressed by Equation (A).

$$V_g = V_{Sig\_m}$$

$$V_s \cong V_{Ofs} - V_{th}$$

$$V_{gs} \cong V_{Sig\_m} - (V_{Ofs} - V_{th}) \tag{A}$$

That is, $V_{gs}$ obtained during the write processing to the drive transistor $TR_D$ depends only on video signal $V_{Sig\_m}$ for controlling luminance in the light-emitting portion ELP, the threshold voltage $V_{th}$ of the drive transistor $TR_D$, and the voltage $V_{Ofs}$ for initializing the potential of the gate electrode of the drive transistor $TR_D$. There is no relation between $V_{gs}$ and the threshold voltage $V_{th-EL}$ of the light-emitting portion ELP.

Next, mobility correction processing will be described in brief. In the above-described operation, during the write processing, the mobility correction processing is also performed for changing the potential of the other area of the source and drain areas of the drive transistor $TR_D$ (that is, the potential on the second node $ND_2$) in accordance with the characteristics of the drive transistor $TR_D$ (for example, the magnitude of mobility $\mu$ and the like).

As described above, in a state where the voltage $V_{CC-H}$ is applied from the power supply portion 100 to one area of the source and drain areas of the drive transistor $TR_D$, the video signal $V_{Sig\_m}$ is applied to the gate electrode of the drive transistor $TR_D$. As shown in FIG. 5, during [period-TP(2)$_4$], the potential on the second node $ND_2$ increases. As a result, when the value of the mobility $\mu$ of the drive transistor $TR_D$ is large, the increased amount $\Delta V$ (potential correction value) of the potential in the source area of the drive transistor $TR_D$ increases. When the value of the mobility $\mu$ of the drive transistor $TR_D$ is small, the increased amount $\Delta V$ (potential correction value) of the potential in the source area of the drive transistor $TR_D$ decreases. The potential difference $V_{gs}$ between the gate electrode and the source area of the drive transistor $TR_D$ is transformed from Equation (A) into Equation (B).

$$V_{gs} \cong V_{Sig\_m} - (V_{Ofs} - V_{th}) - \Delta V \tag{B}$$

As described below, qualitatively, control is preferably performed such that, as the value $V_{Sig\_m}$ decreases, [period-TP(2)$_4$] is extended. JP-A-2008-9198 discloses a configuration in which the falling edge of the scanning signal is inclined so as to control the length of the period in accordance with the value of the video signal.

Through the above-described operations, the threshold voltage cancel processing, the write processing, and the mobility correction processing are completed. In the commencement of subsequent [period-TP(2)$_5$], the write transistor $TR_W$ is turned off by the scanning signal from the scanning line SCL, so the first node $ND_1$ is in a floating state. The voltage $V_{CC-H}$ is applied from the power supply portion 100 to one area of the source and drain areas (hereinafter, also referred to as drain area for convenience) of the drive transistor $TR_D$. As a result, the potential on the second node $ND_2$ increases, the same phenomenon as in a so-called bootstrap circuit occurs in the gate electrode of the drive transistor $TR_D$, and the potential on the first node $ND_1$ also increases. The potential difference $V_{gs}$ between the gate electrode and the source area of the drive transistor $TR_D$ is maintained at the value of Equation (B). A current flowing in the light-emitting portion ELP is a drain current $I_{ds}$ flowing from the drain area of the drive transistor $TR_D$ to the source area. If the drive transistor $TR_D$ ideally operates in a saturation area, the drain current $I_{ds}$ can be expressed by Equation (C). The light-emitting portion ELP emits light with luminance according to the value of the drain current $I_{ds}$. A coefficient k will be described below.

$$I_{ds} = k \cdot \mu \cdot (V_{gs} - V_{th})^2 = k \cdot \mu \cdot (V_{Sig\_m} - V_{Ofs} - \Delta V)^2 \tag{C}$$

From Equation (C), the drain current $I_{ds}$ is proportional to the mobility $\mu$. Meanwhile, as the drive transistor $TR_D$ has a larger mobility $\mu$, the more the potential correction value $\Delta V$ increases, and the value $(V_{Sig\_m} - V_{Ofs} - \Delta V)^2$ in Equation (C) decreases. Thus, variation in the drain current $I_{ds}$ due to variation in the mobility $\mu$ of the drive transistor can be corrected.

The operation of the 2Tr/1C drive circuit described above in brief will be described below in detail.

SUMMARY OF THE INVENTION

The length of the total time $t_0$ of [period-TP(2)$_4$] for obtaining the optimum potential correction value $\Delta V$ depends on the value of the video signal $V_{Sig}$. The optimum value of $t_0$ is given by Equation (13) which is derived afterward.

$$t_0 = C_S / (k \cdot \mu \cdot V_{Sig\_m}) \tag{13}$$

The value of capacitance of $C_s$ is $c_1 + c_{EL}$.

As will be apparent from Equation (13), control is performed such that, as the value of $V_{Sig\_m}$ decreases, such that [period-TP(2)$_4$] is extended. However, in order to perform such control, the configuration of the scanning circuit is complicated. Further, when the scanning period is inevitably set short in accordance with high accuracy of the organic EL display apparatus, it is difficult to ensure [period-TP(2)$_4$] having a sufficient length. Accordingly, the potential correction value $\Delta V$ is insufficient, which causes deterioration in uniformity of luminance of the organic EL display apparatus.

It is desirable to provide a display apparatus and a method of driving a display apparatus capable of adjusting the total length $t_0$ of [period-TP(2)$_4$] for obtaining an optimum potential correction value $\Delta V$, and ensuring favorable mobility correction processing and reducing deterioration in uniformity of luminance even when a scanning period is inevitably set short.

A display apparatus according to an embodiment of the invention and a display apparatus for use in a method of driving a display apparatus according to another embodiment of the invention includes a scanning circuit; a signal output circuit; a plurality of scanning lines which are connected to the scanning circuit and extend in a first direction; a plurality of data lines which are connected to the signal output circuit and extend in a second direction different from the first direction; display devices which are arranged in a two-dimensional matrix, and each has a current-driven light-emitting portion and a drive circuit; and a power supply portion, wherein the drive circuit includes a write transistor, a drive transistor, and a capacitor portion, in the write transistor, one area of source and drain areas is connected to the corresponding data line and a gate electrode is connected to the corresponding scanning line, and, in the drive transistor, one area of source and drain areas is connected to the power supply portion, the other area of the source and drain areas is connected to an anode electrode provided in the light-emitting portion and connected to one electrode of the capacitor portion, and a gate electrode is connected to the other area of the source and drain areas of the write transistor and connected to the other electrode of the capacitor portion.

The method of driving a display apparatus according to another embodiment of the invention includes the step of performing write processing for applying an auxiliary video signal to the corresponding data line, then, applying a video signal, instead of the auxiliary video signal, to the corresponding data line, and in a state where a predetermined drive voltage is applied from the power supply portion to one area of the source and drain areas of the drive transistor, applying a voltage based on the auxiliary video signal and a voltage based on the video signal from the corresponding data line to the gate electrode of the drive transistor through the write transistor which is turned on in response to a scanning signal from the corresponding scanning line.

In the display apparatus according to the embodiment of the invention, an auxiliary video signal is applied to the data line, then, a video signal, instead of the auxiliary video signal, is applied to the data line, and in a state where a predetermined drive voltage is applied from the power supply portion to the one area of the source and drain areas of the drive transistor, a voltage based on the auxiliary video signal and a voltage based on the video signal are applied from the data line to the first node through the write transistor which is turned on in response to a scanning signal from the scanning line.

In the method of driving a display apparatus according to another embodiment of the invention, the voltage based on the auxiliary video signal and the voltage based on the video signal are applied from the data line to the first node. For example, if the value of the auxiliary video signal is set higher than the value of the video signal, during the write processing, change in the potential on the second node is accelerated. Meanwhile, if the value of the auxiliary video signal is set lower than the value of the video signal, during the write processing, change in the potential on the second node is decelerated. By changing the setting of the value of the auxiliary video signal, the length of the total time $t_0$ of [period-$TP(2)_4$] for obtaining an optimum potential correction value $\Delta V$ can be adjusted, and the width of change in the suitable total time $t_0$ due to change in the video signal can be reduced. Further, since the change in the potential on the second node during the write processing can be accelerated, even when the scanning period is inevitably set short, the mobility correction processing can be favorably performed, and deterioration in uniformity of luminance can be reduced. The display apparatus according to the embodiment of the invention can display an image with excellent uniformity of luminance.

BRIEF DESCRIPTION OF THE DRAWINGS

FIGS. 6A to 6F are diagrams schematically showing the on/off states and the like of respective transistors constituting a drive circuit of a display device.

FIG. 9 is a schematic view illustrating a relationship among a potential of a data line, a potential of a scanning line, a state of a drive transistor, a potential on a first node, and a potential on a second node during a horizontal scanning period $H_m$ including [period-$TP(2)_4$] shown in FIG. 4.

FIGS. 10A and 10B are diagrams schematically showing the on/off states and the like of respective transistors constituting a drive circuit of a display device during [period-$TP(2)_4$] shown in FIG. 4.

FIG. 10C is a schematic graph illustrating a relationship between a potential correction value $\Delta V_{Sig}$ and a time $t_{Sig}$ shown in FIG. 9.

FIG. 11 is a schematic circuit diagram illustrating the configuration of a scanning circuit.

DESCRIPTION OF THE PREFERRED EMBODIMENTS

Figure 1:
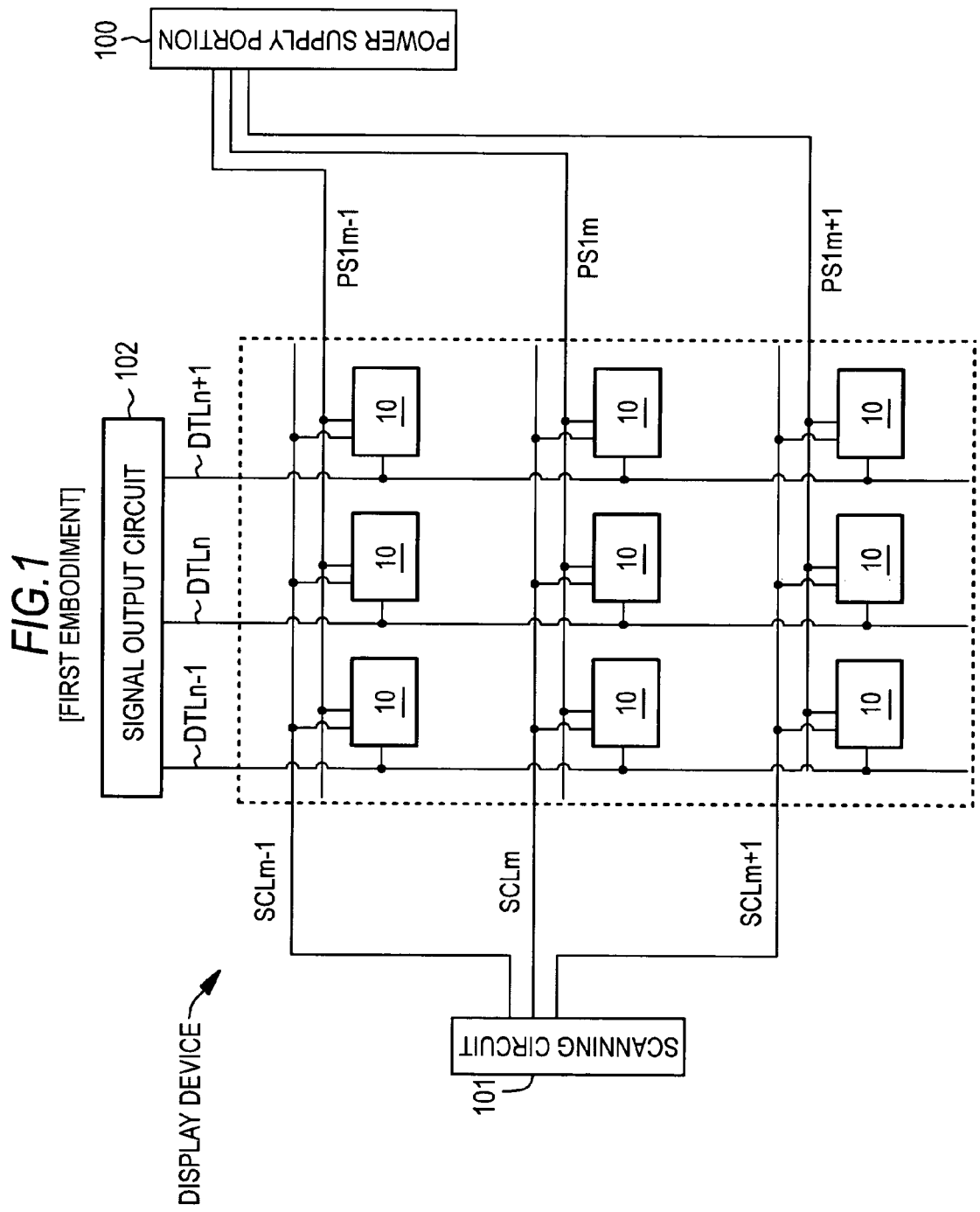
FIG. 1 is a conceptual view of a display apparatus.

Hereinafter, the invention will be described on the basis of examples with reference to the drawings. The description will be made in the following sequence.
1. Detailed description on display apparatus and method of driving display apparatus according to an embodiment of the invention
2. Overview of display apparatus for use in respective examples
3. First Example (2Tr/1C drive circuit)
4. Second Example (2Tr/1C drive circuit)
<Detailed Description on Display Apparatus and Method of Driving Display Apparatus According to the Invention>

In a display apparatus and a method of driving a display apparatus according to an embodiment of the invention (hereinafter, collectively and simply referred to as embodiment of the invention), it is preferable that the value of an auxiliary video signal is basically determined in accordance with design of the display apparatus. In a configuration where the auxiliary video signal has a predetermined value higher than the minimum value of a video signal, when the value of the video signal is low, change in the potential of the second node can be accelerated, and the configuration of a signal output circuit for applying a signal to a data line or the like can be simplified. In particular, in terms of the common use of a voltage, it is preferable that the auxiliary video signal has the same value as the maximum value of the video signal.

Alternatively, according to the embodiment of the invention, the value of the auxiliary video signal can be set in accordance with the value of the video signal. For example, when the value of the auxiliary video signal suitable for the video signal at the time of white display is different from the value of the auxiliary video signal suitable for the video signal at the time of black display, by setting the value of the auxiliary video signal on the basis of the value of the video signal, suitable mobility correction processing can be performed. A configuration may be made that the value of the auxiliary video signal is set with reference to a table or the like, in which the value of the video signal and the value of the auxiliary video signal are stored, or that the value of the video signal is given by a function with the value of the auxiliary video signal as an argument. A range where the value of the video signal can be set may be distributed to a plurality of ranges, and the value of the auxiliary video signal may be set for each range. In terms of image quality adjustment of the display apparatus, it is preferable that a correspondence relationship between the value of the video signal and the value of the auxiliary video signal can be varied as necessary.

According to the embodiment of the invention including the above-described preferred configuration, preprocessing is performed for initializing the potential on the first node and the potential of the second node such that the potential difference between the first node and the second node exceeds the threshold voltage of a drive transistor, and the potential difference between the second node and the cathode electrode of a light-emitting portion does not exceed the threshold voltage of the light-emitting portion. Next, in a state where the potential on the first node is maintained, threshold voltage cancel processing is performed for changing the potential on the second node toward a potential obtained by subtracting the threshold voltage of the drive transistor from the potential on the first node. Thereafter, write processing is performed. Next, a write transistor is turned off in response to a scanning signal from a scanning line, the first node is set in a floating state, and in a state where a predetermined drive voltage is applied from a power supply portion to one area of the source and drain areas of the drive transistor, a current due to the value of the potential difference between the first node and the second node flows into the light-emitting portion through the drive transistor, thereby driving the light-emitting portion.

According to the embodiment of the invention including the above-described preferred configuration, as a light-emitting portion constituting a light-emitting device, a current-driven light-emitting portion which emits light when a current flows therein can be widely used. As the light-emitting portion, an organic electroluminescence light-emitting portion, an inorganic electroluminescence light-emitting portion, an LED light-emitting portion, a semiconductor laser light-emitting portion, or the like may be used. These light-emitting portions may be formed by existing materials or methods. In terms of a flat display apparatus for color display, the light-emitting portion is preferably an organic electroluminescence light-emitting portion. The organic electroluminescence light-emitting portion may be of a so-called top emission type or a bottom emission type.

The display apparatus may be for monochrome display or for color display. For example, the display apparatus may be for color display, in which one pixel includes a plurality of subpixels, specifically, one pixel includes three subpixels of a red light-emission subpixel, a green light-emission subpixel, and a blue light-emission subpixel. Alternatively, the display apparatus may have a configuration that a plurality of subpixels including the three subpixels and one additional subpixel or a plurality of additional subpixels are provided as one set (for example, one set including an additional subpixel emitting white light for luminance improvement, one set including an additional subpixel emitting complementary color light for expanding a color reproduction range, one set including additional subpixels emitting yellow for expanding a color reproduction range, or one set including additional subpixels emitting yellow and cyan light for expanding a color reproduction range.

As the values of pixels of the display apparatus, the resolution for image display, VGA (640,480), S-VGA (800,600), XGA (1024,768), APRC (1152,900), S-XGA (1280,1024), U-XGA (1600,1200), HD-TV (1920,1080), Q-XGA (2048, 1536), (1920,1035), (720,480), (1280,960), or the like may be used. However, the invention is not limited to these values.

In the display apparatus, with regard to the configuration and structures of various circuits, such as a scanning circuit, a signal output circuit, and the like, wiring lines, such as scanning lines, data lines, and the like, a power supply portion, and a light-emitting portion, existing configuration and structures may be used. For example, when a light-emitting portion is an organic electroluminescence light-emitting portion, the light-emitting portion may include an anode electrode, a hole transport layer, a light-emitting layer, an electron transport layer, a cathode electrode, and the like.

As transistors constituting the drive circuit, n-channel thin film transistors (TFTs) may be used. The transistors constituting the drive circuit may be of an enhancement type or a depression type. In the case of the n-channel transistors, an LDD (Lightly Doped Drain) structure may be formed. As occasion demands, the LDD structure may be formed asymmetrically. For example, a large current flows in the drive transistor when a display device emits light, so the LDD structure may be formed only on the side of one area of the source and drain areas, that is, the side of the drain area at the time of light emission. As the write transistor and the like, p-channel thin film transistors may be used.

A capacitor portion constituting the drive circuit may include one electrode, the other electrode, and a dielectric layer (insulating layer) sandwiched between the one electrode and the other electrode. The transistors and the capacitor portion constituting the drive circuit are formed within a plane (for example, formed on a support), and the light-emitting portion is formed above the transistors and the capacitor portion constituting the drive circuit through an insulating interlayer. The other area of the source and drain areas of the drive transistor is connected to the anode electrode provided in the light-emitting portion through a contact hole. The transistors may be formed on a semiconductor substrate or the like.

Prior to describing the invention on the basis of examples with reference to the drawings, the overview of a display apparatus for use in the respective examples will be described.

<Overview of Display Apparatus for Use in Respective Examples>

A display apparatus for use in the respective examples is a display apparatus including a plurality of pixels. One pixel includes a plurality of subpixels (in the respective examples, three subpixels of a red light-emission subpixel, a green light-emission subpixel, and a blue light-emission subpixel). The light-emitting portion is an organic electroluminescence light-emitting portion. Each of the subpixels includes a drive circuit 11 and a display device 10 in which a light-emitting portion (light-emitting portion ELP) connected to the drive circuit 11 is laminated.

FIG. 1 is a conceptual view of a display apparatus according to Examples 1 and 2.

Figure 2:
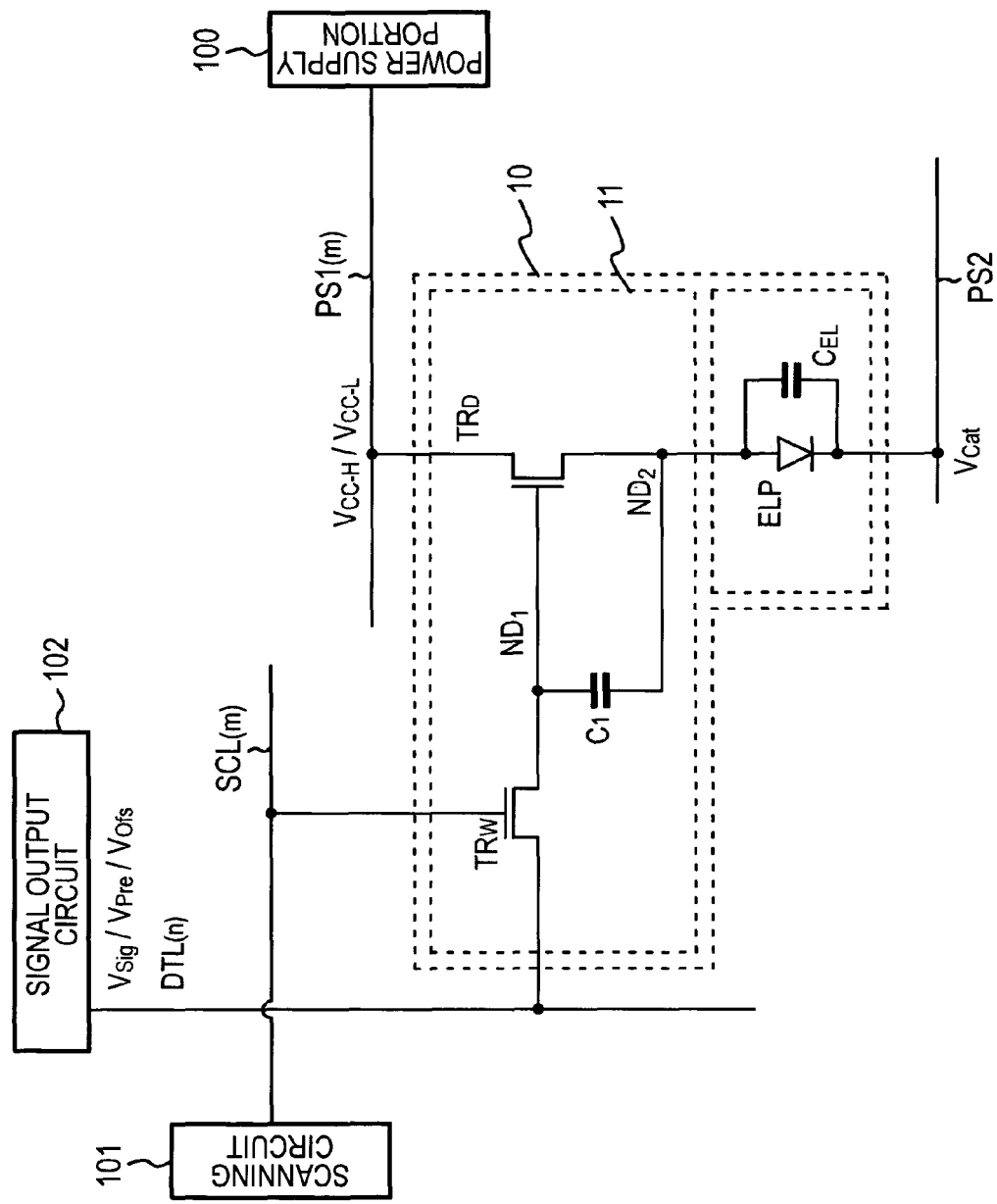
FIG. 2 is an equivalent circuit diagram of a display device including a drive circuit.

FIG. 2 shows a drive circuit (also referred to as 2Tr/1C drive circuit) primarily including two transistors and one capacitor portion.

In the respective examples, the display apparatus includes (1) a scanning circuit 101, (2) a signal output circuit 102, (3) N×M display devices 10 in total which are arranged in a two-dimensional matrix of N display devices in a first direction and M display devices in a second direction different from the first direction and each has a light-emitting portion ELP and a drive circuit 11 for driving the light-emitting portion ELP, (4) M scanning lines SCL which are connected to the scanning circuit 101 and extend in the first direction, (5) N data lines DTL which are connected to the signal output circuit 102 and extend in the second direction, and (6) a power supply portion 100. Although in FIG. 1, 3×3 display devices 10 are shown, this is just for illustration. For convenience, in FIG. 1, a power supply line PS2 shown in FIG. 2 or the like is omitted.

The light-emitting portion ELP has an existing configuration that an anode electrode, a hole transport layer, a light-emitting layer, an electron transport layer, a cathode electrode, and the like are provided. With regard to the configuration and structures of the scanning circuit 101, the signal output circuit 102, the scanning lines SCL, the data lines DTL, and the power supply portion 100, existing configuration and structures may be used.

The minimum constituent device of the drive circuit 11 will be described. The drive circuit 11 includes at least a drive transistor $TR_D$, a write transistor $TR_W$, and a capacitor portion $C_1$ having a pair of electrodes. The drive transistor $TR_D$ is an n-channel TFT including source and drain areas, channel forming area, and a gate electrode. The write transistor $TR_W$ is also an n-channel TFT including source and drain areas, a channel forming area, and a gate electrode. The write transistor $TR_W$ may be a p-channel TFT. The drive circuit 11 may include an additional transistor.

In the drive transistor $TR_D$, (A-1) one area of the source and drain areas is connected to the power supply portion 100, (A-2) the other area of the source and drain areas is connected to the anode electrode provided in the light-emitting portion ELP, is connected to one electrode of the capacitor portion $C_1$, and forms a second node $ND_2$, (A-3) a gate electrode is connected to the other area of the source and drain areas of the write transistor $TR_W$, is connected to the other electrode of the capacitor portion $C_1$, and forms a first node $ND_1$.

In the write transistor $TR_W$, (B-1) one area of the source and drain areas is connected to the data line DTL, and (B-2) a gate electrode is connected to the scanning line SCL.

Figure 3:
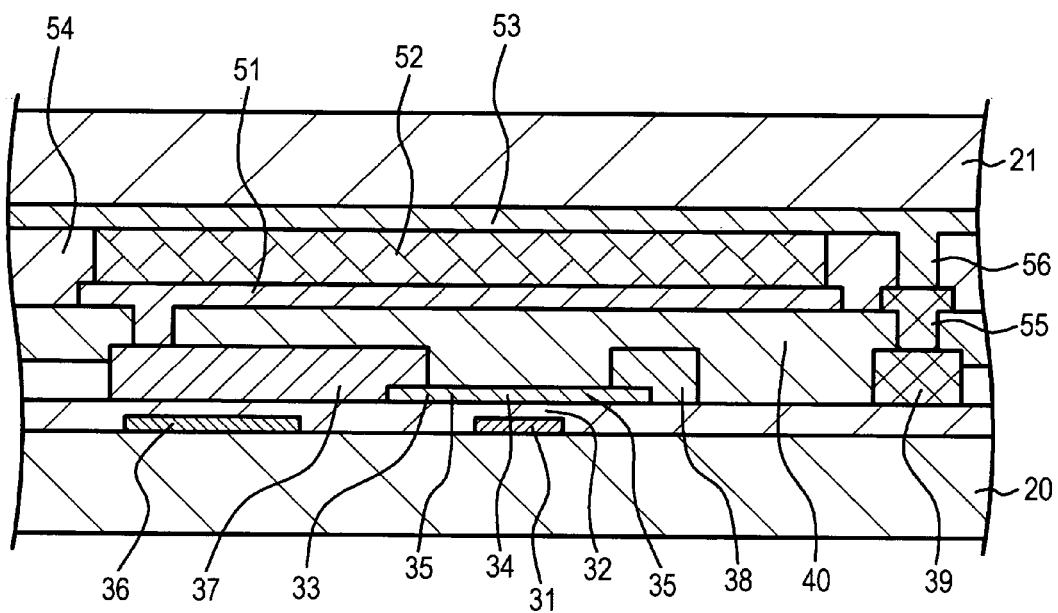
FIG. 3 is a schematic partial sectional view of a portion of a display apparatus.

FIG. 3 is a schematic partial sectional view of a portion of a display apparatus. The transistors $TR_D$ and $TR_W$ and the capacitor portion $C_1$ constituting the drive circuit 11 are formed on a support 20, and the light-emitting portion ELP is formed above the transistors $TR_D$ and $TR_W$ and the capacitor portion $C_1$ constituting the drive circuit 11 through an insulating interlayer 40. The other area of the source and drain areas of the drive transistor $TR_D$ is connected to the anode electrode provided in the light-emitting portion ELP through a contact hole. FIG. 3 only shows the drive transistor $TR_D$. Other transistors are hidden and invisible.

More specifically, the drive transistor $TR_D$ includes a gate electrode 31, a gate insulating layer 32, source and drain areas 35 and 35 provided in a semiconductor layer 33, and a channel forming area 34, which is a portion of the semiconductor layer 33 between the source and drain areas 35 and 35. Meanwhile, the capacitor portion $C_1$ includes the other electrode 36, a dielectric layer, which is an extended portion of the gate insulating layer 32, and one electrode 37 (corresponding to the second node $ND_2$). The gate electrode 31, a portion of the gate insulating layer 32, and the other electrode 36 constituting the capacitor portion $C_1$ are formed on the support 20. The one area 35 of the source and drain areas of the drive transistor $TR_D$ is connected to a wiring line 38, and the other area 35 of the source and drain areas 35 is connected to the one electrode 37. The drive transistor $TR_D$, the capacitor portion $C_1$, and the like are covered with the insulating interlayer 40, and the light-emitting portion ELP including an anode electrode 51, a hole transport layer, a light-emitting layer, an electron transport layer, and a cathode electrode 53 is provided on the insulating interlayer 40. In the drawing, the hole transport layer, the light-emitting layer, and the electron transport layer are shown as a single layer 52. A second insulating interlayer 54 is provided on a portion of the insulating interlayer 40 where the light-emitting portion ELP is not provided, and a transparent substrate 21 is provided on the second insulating interlayer 54 and the cathode electrode 53. Light emitted from the light-emitting layer passes through the substrate 21 and is emitted to the outside. The one electrode 37 (second node $ND_2$) and the anode electrode 51 are connected to each other through a contact hole provided in the insulating interlayer 40. The cathode electrode 53 is connected to a wiring line 39 provided on the extended portion of the gate insulating layer 32 through contact holes 56 and 55 provided in the second insulating interlayer 54 and the insulating interlayer 40.

A method of manufacturing the display apparatus shown in FIG. 3 or the like will be described. First, various wiring lines, such as the scanning lines SCL and the like, the electrodes constituting the capacitor portion $C_1$, the transistors including the semiconductor layer, the insulating interlayer, the contact holes, and the like are appropriately formed on the support 20 by existing methods. Next, film formation and patterning are performed by existing methods to form the light-emitting portions ELP arranged in a matrix. Then, the support 20 prepared as above and the substrate 21 are arranged to be opposite each other and sealed along the periphery thereof, and wiring lines are connected to the external circuit, thereby obtaining the display apparatus.

The display apparatus of the respective examples is a display apparatus for color display including a plurality of display devices 10 (for example, N×M=1920×480). Each of the display devices 10 forms a subpixel, a group having a plurality of subpixels forms one pixel, and the pixels are arranged in a two-dimensional matrix in a first direction and a second direction different from the first direction. One pixel includes three subpixels of a red light-emission subpixel emitting red light, a green light-emission subpixel emitting green light, and a blue light-emission subpixel emitting blue light arranged in the extension direction of the scanning lines SCL.

The display apparatus includes (N/3)×M pixels arranged in a two-dimensional matrix. It is assumed that the display devices 10 constituting the respective pixels are line-sequentially scanned, and a display frame rate is FR (times/second). That is, the display devices 10 constituting (N/3) pixels (N subpixels) arranged in an m-th row (where m=1, 2, 3, ..., M) are simultaneously driven. In other words, with regard to the display devices 10 constituting one row, the light-emission/non-light-emission timing is controlled in rows to which the display devices 10 belong. Write processing for writing a video signal to the respective pixels constituting one row may be write processing (hereinafter, simply referred to as simultaneous write processing) for writing the video signal to all the pixels simultaneously, or write processing (hereinafter, simply referred to as sequential write processing) for sequentially writing the video signal to the respective pixels. One kind of write processing may be appropriately selected in accordance with the configuration of the display apparatus.

As described above, the display devices 10 in the first to M-th rows are line-sequentially scanned. For convenience of description, a period which is allocated so as to scan the display devices 10 in each row is represented by a horizontal scanning period. In the respective examples described below, during each horizontal scanning period, there are a period (hereinafter, referred to as initialization period) in which a first node initialization voltage is applied from the signal output circuit 102 to the data line DTL, and a period (hereinafter, referred to as video signal period) in which an auxiliary video signal ($V_{Pre}$ described below) and a video signal $V_{Sig}$ are applied from the signal output circuit 102 to the data line DTL.

Here, the driving and operation of the display device 10 in the m-th row and the n-th column (where n=1, 2, 3 ..., N) will be described, and the relevant display device 10 is hereinafter called an (n,m)th display device 10 or an (n,m)th subpixel. Various kinds of processing (threshold voltage cancel processing, write processing, and mobility correction processing described below) are performed until the horizontal scanning period of each of the display devices 10 arranged in the m-th row (m-th horizontal scanning period) ends. The write processing or the mobility correction processing is performed within the m-th horizontal scanning period. Meanwhile, in any drive circuit, threshold voltage cancel processing or pre-processing associated with the threshold voltage cancel processing may be performed earlier than the m-th horizontal scanning period.

After various kinds of processing described above end, the light-emitting portion ELP constituting each of the display devices 10 arranged in the m-th row emits light. Alternatively, the light-emitting portion ELP may emit light immediately after various kinds of processing described above end, or the light-emitting portion ELP may emit light after a predetermined period (for example, horizontal scanning periods for a predetermined number of rows) has elapsed. The predetermined period can be appropriately set in accordance with the specification of the display apparatus or the configuration of the drive circuit. In the following description, for convenience of description, it is assumed that the light-emitting portion ELP emits light immediately after various kinds of processing end. The light-emission state of the light-emitting portion ELP constituting each of the display devices 10 arranged in the m-th row is continuously maintained immediately before the horizontal scanning period of each of the display devices 10 in (m+m')th row. Here, "m'" is determined by the design specification of the display apparatus. That is, light emission of the light-emitting portion ELP of each of the display devices 10 arranged in the m-th row of any display frame is maintained to the (m+m'−1)th horizontal scanning period. Meanwhile, from the commencement of the (m+m')th horizontal scanning period until the write processing or mobility correction processing is completed within the m-th horizontal scanning period of the next display frame, the light-emitting portion ELP of each of the display devices 10 arranged in the m-th row is principally maintained in the non-light-emission. By providing the period of the above-described non-light-emission state (hereinafter, simply referred to as a non-light-emission period), residual image blur due to active matrix drive can be reduced, and excellent display quality can be achieved. However, the light-emission state/non-light-emission state of each of the subpixels (display devices 10) is not limited to the above-described states. The time length of the horizontal scanning period is less than $(1/FR) \times (1/M)$ seconds. When the value of (m+m') exceeds M, the excessive horizontal scanning period is processed during the next display frame.

In two source and drain areas of one transistor, the term "one area of the source and drain areas" may mean the source/drain area connected to the power supply. The term "a transistor is turned on" means a state where a channel is formed between the source and drain areas. There is no consideration of whether a current flows from the one area of the source and drain areas of the relevant transistor to the other area of the source and drain areas or not. Meanwhile, the term "a transistor is turned off" means a state where no channel is formed between the source and drain areas. The term "the source/drain area of one transistor is connected to the source/drain area of another transistor includes a case where the source/drain area of one transistor and the source/drain area of another transistor occupy the same area. The source/drain area may be not only made of conductive material, such as polysilicon containing an impurity or amorphous silicon, but also made of a metal, an alloy, or conductive particles. Alternatively, the source/drain area may be structured in the form of a laminate structure thereof, or a layer made of an organic material (conductive polymer). In each of timing charts used in the following description, the length (time length) of a horizontal axis representing each period is schematic, and thus does not represent a rate of the time length of the period. The same is applied to the vertical axis. In each of the timing charts, the shape of a waveform is schematic.

Hereinafter, the invention will be described on the basis of examples.

Example 1

Example 1 relates to a display apparatus and a method of driving a display apparatus according to an embodiment of the invention. In Example 1, the drive circuit 11 includes two transistors and one capacitor portion. FIG. 2 is an equivalent circuit diagram of the display device 10 including the drive circuit 11.

First, the drive circuit or the light-emitting portion will be described in detail.

The drive circuit 11 includes two transistors of a write transistor $TR_W$ and a drive transistor $TR_D$, and one capacitor portion $C_1$ (2Tr/1C drive circuit).

[Drive Transistor $TR_D$]

One area of the source and drain areas of the drive transistor $TR_D$ is connected to the power supply portion 100 through a power supply line PS1. The other area of the source and drain areas of drive transistor $TR_D$ is connected to [1] the anode electrode of the light-emitting portion ELP and [2] one electrode of the capacitor portion $C_1$, and forms a second node $ND_2$. The gate electrode of the drive transistor $TR_D$ is connected to [1] the other area of the source and drain areas of the write transistor $TR_W$ and [2] the other electrode of the capacitor portion $C_1$, and forms a first node $ND_1$. A voltage $V_{CC\text{-}H}$ and a voltage $V_{CC\text{-}L}$ are applied from the power supply portion 100, as described below.

In the light-emission state of the display device 10, the drive transistor $TR_D$ is driven such that a drain current $I_{ds}$ flows in accordance with Equation (1). In the light-emission state of the display device 10, the one area of the source and drain areas of the drive transistor $TR_D$ acts as a drain area, and the other area of the source and drain areas of the drive transistor $TR_D$ acts as a source area. For convenience of description, in the following description, the one area of the source and drain areas of the drive transistor $TR_D$ may be simply referred to as drain area, and the other area of the source and drain areas of the drive transistor $TR_D$ may be simply referred to as source area. The following equation is defined.

$\mu$: effective mobility
L: channel length
W: channel width
$V_{gs}$: potential difference between gate electrode and source area
$V_{th}$: threshold voltage
$C_{ox}$: (specific dielectric constant of gate insulating layer)×(vacuum dielectric constant)/(thickness of gate insulating layer)

$$k \equiv (1/2) \cdot (W/L) \cdot C_{ox}$$

$$I_{ds} = k \cdot \mu \cdot (V_{gs} - V_{th})^2 \quad (1)$$

If the drain current $I_{ds}$ flows in the light-emitting portion ELP of the display device 10, the light-emitting portion ELP of the display device 10 emits light. The light-emission state (luminance) of the light-emitting portion ELP of the display device 10 is controlled depending on the magnitude of the value of the drain current $I_{ds}$.

[Write Transistor $TR_W$]

As described above, the other area of the source and drain areas of the write transistor $TR_W$ is connected to the gate electrode of the drive transistor $TR_D$. One area of the source and drain areas of the write transistor $TR_W$ is connected to the data line DTL. A video signal (drive signal, luminance signal) $V_{Sig}$ for controlling luminance in the light-emitting portion ELP is supplied from the signal output circuit 102 to the one area of the source and drain areas of the write transistor $TR_W$ through the data line DTL. An auxiliary video signal $V_{Pre}$ and a first node initialization voltage $V_{Ofs}$ described below are supplied to the one area of the source and drain areas of the write transistor $TR_W$ through the data line DTL. The on/off operation of the write transistor $TR_W$ is controlled by a scanning signal from the scanning line SCL connected to the gate electrode of the write transistor $TR_W$, specifically, the scanning signal from the scanning circuit 101.

[Light-Emitting Portion ELP]

As described above, the anode electrode of the light-emitting portion ELP is connected to the source area of the drive transistor $TR_D$. The cathode electrode of the light-emitting portion ELP is connected to the power supply line PS2 to which a voltage $V_{Cat}$ is applied. Parasitic capacitance of the light-emitting portion ELP is represented by symbol $C_{EL}$. It is assumed that a threshold voltage necessary for light emission of the light-emitting portion ELP is $V_{th-EL}$. That is, if a voltage equal to or higher than $V_{th-EL}$ is applied between the anode electrode and the cathode electrode of the light-emitting portion ELP, the light-emitting portion ELP emits light.

Next, the display apparatus of Example 1 and the driving method thereof will be described.

Although in the following description, the values of voltage or potential are set as follows, the values are just for illustration, but the invention is not limited to the values.

$V_{Sig}$: video signal for controlling luminance in light-emitting portion ELP . . . 1 volt (black display) to 8 volts (white display)

$V_{Pre}$: auxiliary video signal . . . 8 volts $V_{CC-H}$ drive voltage for allowing a current to flow in light-emitting portion ELP . . . 20 volts $V_{CC-L}$: second node initialization voltage . . . −10 volts $V_{Ofs}$: first node initialization voltage for initializing potential of gate electrode of drive transistor $TR_D$ (potential on first node $ND_1$) . . . 0 volt $V_{th}$: threshold voltage of drive transistor $TR_D$ . . . 3 volts $V_{Cat}$: voltage applied to cathode electrode of light-emitting portion ELP . . . 0 volt $V_{th-EL}$: threshold voltage of light-emitting portion ELP . . . 3 volts In the display apparatus, the auxiliary video signal $V_{Pre}$ is applied to the data line DTL, then, the video signal $V_{Sig}$, instead of the auxiliary video signal $V_{Pre}$, is applied to the data line DTL, and in a state where a predetermined drive voltage $V_{CC-H}$ is applied from the power supply portion 100 to the one area of the source and drain areas of the drive transistor $TR_D$, a voltage based on the auxiliary video signal $V_{Pre}$ and a voltage based on the video signal $V_{Sig}$ are applied from the data line DTL to the first node $ND_1$ through the write transistor $TR_W$ which is turned on in response to the scanning signal from the scanning line SCL.

The method of driving the display apparatus in the respective examples (hereinafter, simply referred to as driving method) includes a step of performing write processing for applying the auxiliary video signal $V_{Pre}$ to the data line DTL, then, applying the video signal $V_{Sig}$, instead of the auxiliary video signal $V_{Pre}$, to the data line DTL, and in a state where the predetermined drive voltage $V_{CC-H}$ is applied from the power supply portion 100 to the one area of the source and drain areas of the drive transistor $TR_D$, applying a voltage based on the auxiliary video signal $V_{Pre}$ and a voltage based on the video signal $V_{Sig}$ from the data line DTL to the first node $ND_1$ through the write transistor $TR_W$ which is turned on in response to the scanning signal from the scanning line SCL.

Figure 4:
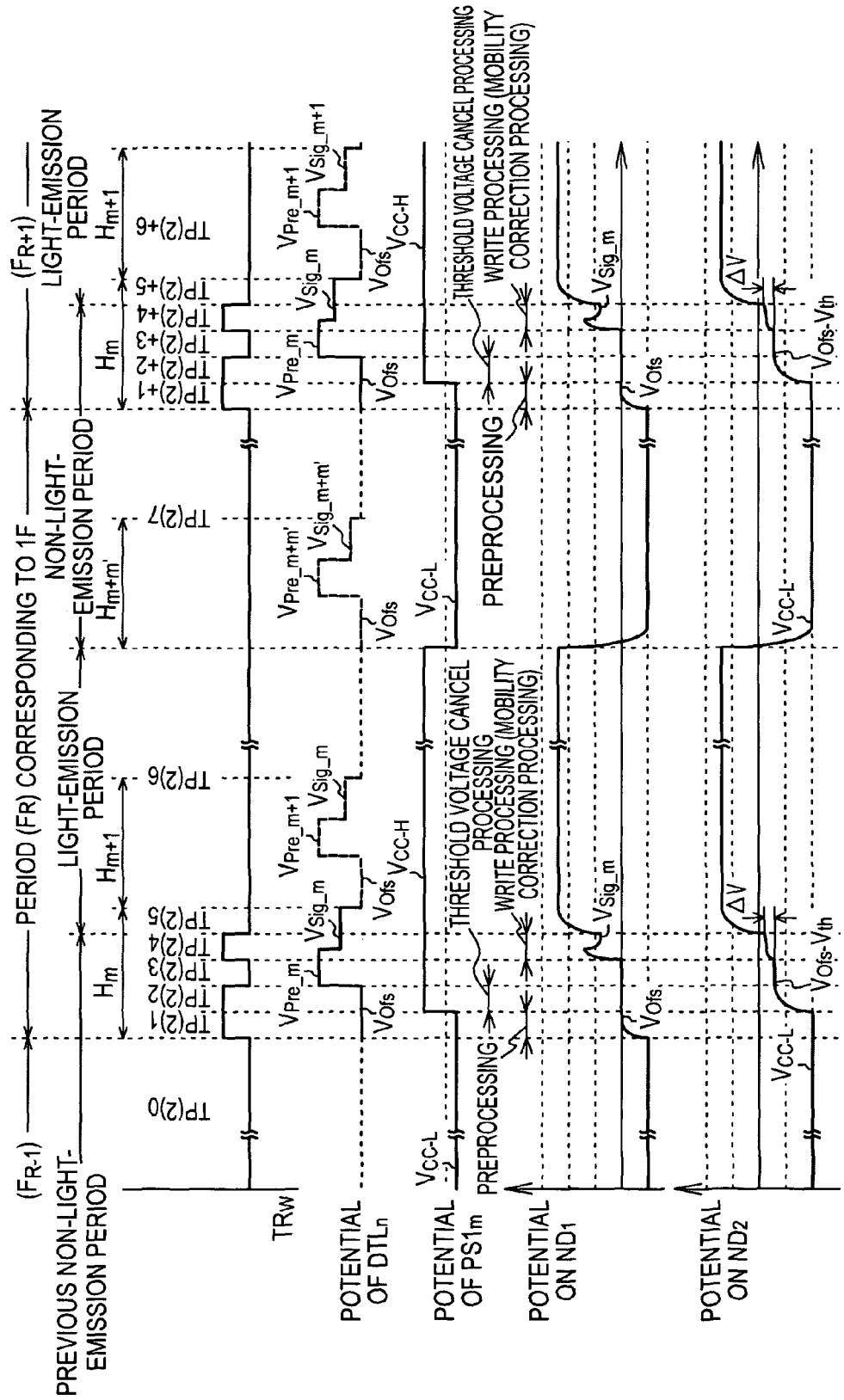
FIG. 4 is a schematic view showing a drive timing chart of a display device according to Example 1.
Figure 5:
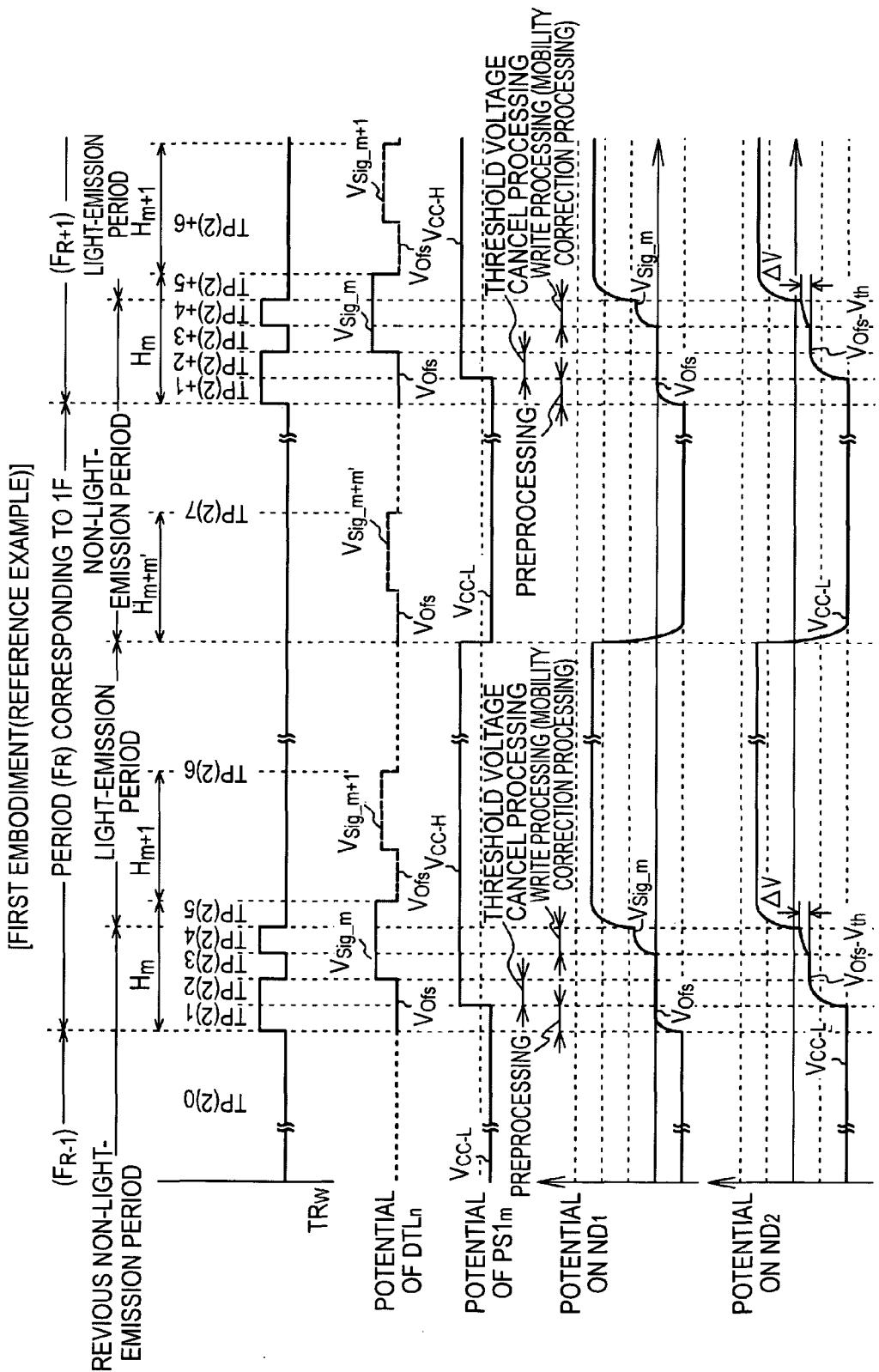
FIG. 5 is a schematic view showing a drive timing chart of a display device according to a reference example.

First, for ease of understanding of the invention, the operation of the driving method when the display apparatus of Example 1 is used and the auxiliary video signal $V_{Pre}$ is not applied to the data line DTL will be described as a driving method of a reference example. FIG. 4 schematically shows a drive timing chart of the display device 10 according to Example 1. FIG. 5 schematically shows a drive timing chart of the display device 10 according to the reference example. FIGS. 6A to 6F schematically show the on/off state and the like of the respective transistors of the display device 10 during the operation of the reference example.

The driving method of the reference example will be described with reference to FIGS. 5 and 6A to 6F. The driving method of the reference example includes the following steps: (a) preprocessing is performed for initializing the potential on the first node $ND_1$ and the potential on the second node $ND_2$ such that the potential difference between the first node $ND_1$ and the second node $ND_2$ exceeds the threshold voltage $V_{th}$ of the drive transistor $TR_D$, and the potential difference between the second node $ND_2$ and the cathode electrode provided in the light-emitting portion ELP does not exceed the threshold voltage $V_{th-EL}$ of the light-emitting portion ELP; (b) threshold voltage cancel processing is performed for changing the potential on the second node $ND_2$ toward a potential obtained by subtracting the threshold voltage $V_{th}$ of the drive transistor $TR_D$ from the first node $ND_1$ in a state where the potential on the first node $ND_1$ is maintained; (c) write processing is performed for applying the video signal $V_{Sig}$ to the data line DTL, and in a state where a predetermined drive voltage $V_{CC-H}$ is applied from the power supply portion 100 to the one area of the source and drain areas of the drive transistor $TR_D$, applying a voltage based on the video signal $V_{Sig}$ from the data line DTL to the first node $ND_1$ through the write transistor $TR_W$ which is turned on in response to the scanning signal from the scanning line SCL; and (d) the write transistor $TR_W$ is turned off in response to the scanning signal from the scanning line SCL to set the first node $ND_1$ in the floating state, and in a state where a predetermined drive voltage $V_{CC-H}$ is applied from the power supply portion 100 to the one area of the source and drain areas of the drive transistor $TR_D$, a current according to the value of the potential difference between the first node $ND_1$ and the second node $ND_2$ flows in the light-emitting portion ELP through the drive transistor $TR_D$, thereby driving the light-emitting portion ELP.

In FIG. 5, [period-TP(2)$_0$] to [period-TP(2)$_3$] are an operation period immediately before [period-TP(2)$_4$] in which the write processing is performed. During [period-TP(2)$_0$] to [period-TP(2)$_3$], the (n,m)th display device 10 is principally in the non-light-emission state. As shown in FIG. 5, in addition to [period-TP(2)$_4$] and [period-TP(2)$_5$], [period-TP(2)$_1$] to [period-TP(2)$_3$] are included in the m-th horizontal scanning period $H_m$.

For convenience of description, it is assumed that the commencement of [period-TP(2)$_1$] is aligned with the commencement of an initialization period in the m-th horizontal scanning period H$_m$ (in FIG. 5, a period in which the potential of the data line DTL is V$_{Ofs}$; the same is applied to other horizontal scanning periods). Similarly, it is assumed that the termination of [period-TP(2)$_2$] is aligned with the termination of the initialization period in the horizontal scanning period H$_m$. It is also assumed that the commencement of [period-TP(2)$_3$] is aligned with the commencement of the video signal period in the horizontal scanning period H$_m$ (in FIG. 5, a period in which the potential of the data line DTL is V$_{Sig\_m}$ described below).

Hereinafter, [period-TP(2)$_0$] to [period-TP(2)$_{+6}$] will be described. The length of each of [period-TP(2)$_1$] to [period-TP(2)$_3$] may be appropriately set in accordance with design of the display apparatus.

[period-TP(2)$_0$] (see FIGS. 5 and 6A)

[period-TP(2)$_0$] is an operation from the previous display frame to the current display frame. That is, [period-TP(2)$_0$] is a period from the (m+m')th horizontal scanning period H$_{m+m'}$, in the previous display frame to the (m−1)th horizontal scanning period H$_{m-1}$ in the current display frame. During [period-TP(2)$_0$], the (n,m)th display device 10 is in the non-light-emission state. In the commencement (not shown) of [period-TP(2)$_0$], a voltage which is supplied from the power supply portion 100 is changed from the drive voltage V$_{CC-H}$ to the second node initialization voltage V$_{CC-L}$. As a result, the potential on the second node ND$_2$ decreases to V$_{CC-L}$, and a backward voltage is applied between the anode electrode and the cathode electrode of the light-emitting portion ELP, such that the light-emitting portion ELP is in the non-light-emission state. The potential on the first node ND$_1$ (the gate electrode of the drive transistor TR$_D$) in the floating state also decreases so as to follow the decrease in the potential on the second node ND$_2$.

As described above, in each horizontal scanning period, the first node initialization voltage V$_{Ofs}$ is applied from the signal output circuit 102 to the data line DTL, then, the video signal V$_{Sig}$ is applied, instead of the first node initialization voltage V$_{Ofs}$. Specifically, the first node initialization voltage V$_{Ofs}$ is applied to the data line DTL to correspond to the m-th horizontal scanning period H$_m$ in the current display frame, then, the video signal (for convenience, represented by V$_{Sig\_m}$; the same is applied to other video signals) corresponding to the (n,m)th subpixel is applied, instead of the first node initialization voltage V$_{Ofs}$. Similarly, the first node initialization voltage V$_{Ofs}$ is applied to the data line DTL to correspond to the (m+1)th horizontal scanning period H$_{m+1}$, then, the video signal V$_{Sig\_m+1}$ corresponding to the (n,m+1)th subpixel is applied, instead of the first node initialization voltage V$_{Ofs}$. Though not shown in FIG. 5, in each of the horizontal scanning periods other than the horizontal scanning periods H$_m$, H$_{m+1}$, and H$_{m+m'}$, the first node initialization voltage V$_{Ofs}$ and the video signal V$_{Sig}$ are applied to the data line DTL.

[period-TP(2)$_1$] (see FIGS. 5 and 6B)

The m-th horizontal scanning period H$_m$ in the current display frame starts. During [period-TP(2)$_1$], the step (a) is performed.

Specifically, at the time of the start of [period-TP(2)$_1$], the scanning line SCL is at high level, such that the write transistor TR$_W$ is turned on. A voltage which is supplied from the signal output circuit 102 to the data line DTL is V$_{Ofs}$ (initialization period). As a result, the potential on the first node ND$_1$ becomes V$_{Ofs}$ (0 volt). The second node initialization voltage V$_{CC-L}$ is applied from the power supply portion 100 to the second node ND$_2$, so the potential on the second node ND$_2$ is maintained at V$_{CC-L}$ (−10 volt).

The potential difference between the first node ND$_1$ and the second node ND$_2$ is 10 volts, and the threshold voltage V$_{th}$ of the drive transistor TR$_D$ is 3 volts, such that the drive transistor TR$_D$ is turned on. The difference potential between the second node ND$_2$ and the cathode electrode provided in the light-emitting portion ELP is −10 volts, which does not exceed the threshold voltage V$_{th-EL}$ of the light-emitting portion ELP. Thus, the preprocessing for initializing the potential on the first node ND$_1$ and the potential on the second node ND$_2$ is completed.

[period-TP(2)$_2$] (see FIGS. 5 and 6C)

During [period-TP(2)$_2$], the step (b) is performed.

That is, in a state where the write transistor TR$_W$ is turned on, the voltage which is supplied from the power supply portion 100 is changed from V$_{CC-L}$ to the voltage V$_{CC-H}$. As a result, while the potential on the first node ND$_1$ is not changed (V$_{Ofs}$ is maintained at 0 volt), and the potential on the second node ND$_2$ is changed toward a potential obtained by subtracting the threshold voltage V$_{th}$ of the drive transistor TR$_D$ from the potential on the first node ND$_1$. That is, the potential on the second node ND$_2$ in the floating state increases. For convenience of description, it is assumed that [period-TP(2)$_2$] has a sufficient length such that the potential on the second node ND$_2$ sufficiently changes.

If [period-TP(2)$_2$] is sufficiently long, the potential difference between the gate electrode and the other area of the source and drain areas of the drive transistor TR$_D$ reaches V$_{th}$, and the drive transistor TR$_D$ is turned off. That is, the potential on the second node ND$_2$ in the floating state approximates to (V$_{Ofs}$−V$_{th}$=−3 volt) and finally becomes (V$_{Ofs}$−V$_{th}$). If Equation (2) is guaranteed, in other words, the potentials are selected and determined so as to satisfy Equation (2), the light-emitting portion ELP does not emit light.

$$(V_{Ofs}-V_{th})<(V_{th-EL}+V_{cat}) \quad (2)$$

During [period-TP(2)$_2$], the potential on the second node ND$_2$ finally becomes (V$_{Ofs}$−V$_{th}$). That is, the potential on the second node ND$_2$ is determined only depending on the threshold voltage V$_{th}$ of the drive transistor TR$_D$ and the voltage V$_{Ofs}$ for initializing the potential of the gate electrode of the drive transistor TR$_D$. There is no relation between the potential on the second node ND$_2$ and the threshold voltage V$_{th-EL}$ of the light-emitting portion ELP.

[period-TP(2)$_3$] (see FIGS. 5 and 6D)

In the commencement of [period-TP(2)$_3$], the write transistor TR$_W$ is turned off in response to the scanning signal from the scanning line SCL. A voltage which is applied to the data line DTL is changed from the first node initialization voltage V$_{Ofs}$ to the video signal V$_{Sig\_m}$ (video signal period). In the threshold voltage cancel processing, if the drive transistor TR$_D$ reaches the off state, substantially, the potential on the first node ND$_1$ and the second node ND$_2$ has no change. In the threshold voltage cancel processing, when the drive transistor TR$_D$ does not reach the off state, during [period-TP(2)$_3$], a bootstrap operation occurs, and the potential on the first node ND$_1$ and the second node ND$_2$ slightly increase.

[period-TP(2)$_4$] (see FIGS. 5 and 6E)

Within this period, the step (c) is performed. The write transistor TR$_W$ is turned on in response to the scanning signal from the scanning line SCL. Then, the video signal V$_{Sig\_m}$ is applied from the data line DTL to the first node ND$_1$ through the write transistor TR$_W$. As a result, the potential on the first node ND$_1$ increases to V$_{Sig\_m}$. The drive transistor TR$_D$ is in the on state. As occasion demands, during [period-TP(2)$_3$], the on state of the write transistor TR$_W$ may be maintained. In this configuration, during [period-TP(2)$_3$], if the voltage of the data line DTL is changed from the first node initialization voltage $V_{Ofs}$ to the video signal $V_{Sig\_m}$, the write processing starts immediately.

It is assumed that the capacitance of the capacitor portion $C_1$ is $c_1$, and the capacitance $C_{EL}$ of the light-emitting portion ELP is $c_{EL}$. It is also assumed that parasitic capacitance between the gate electrode and the other area of the source and drain areas of the drive transistor $TR_D$ is $c_{gs}$. When the potential of the gate electrode of the drive transistor $TR_D$ is changed from $V_{Ofs}$ to $V_{Sig\_m}(>V_{Ofs})$ the potential between both ends of the capacitor portion $C_1$ (the potential between the first node $ND_1$ and the second node $ND_2$) principally changes. That is, electric charges based on the change amount $(V_{Sig\_m}-V_{Ofs})$ of the potential of the gate electrode of the drive transistor $TR_D$ (=the potential on the first node $ND_1$) are distributed to the capacitor portion $C_1$, the capacitance $C_{EL}$ of the light-emitting portion ELP, and parasitic capacitance between the gate electrode and the other area of the source and drain areas of the drive transistor $TR_D$. If the value $c_{EL}$ is larger than the value $c_1$ and the value $c_{gs}$, there is small change in the potential of the other area of the source and drain areas (second node $ND_2$) of the drive transistor $TR_D$ based on the change amount $(V_{Sig\_m}-V_{Ofs})$ of the potential of the gate electrode of the drive transistor $TR_D$. In general, the value $c_{EL}$ of the capacitance $C_{EL}$ of the light-emitting portion ELP is larger than the value $c_1$ of the capacitance of the capacitor portion $C_1$ and the value $c_{gs}$ of parasitic capacitance of the drive transistor $TR_D$. Thus, in the above description, there is no consideration of change in the potential on the second node $ND_2$ due to change in the potential on the first node $ND_1$. The description will be made without taking into consideration the change in the potential on the second node $ND_2$ due to the change in the potential on the first node $ND_1$ except for the case where there is a particular necessity. The same is applied to other examples. The drive timing charts are shown without taking into consideration the change in the potential on the second node $ND_2$ due to the change in the potential on the first node $ND_1$.

In the above-described write processing, in a state where the drive voltage $V_{CC\text{-}H}$ is applied from the power supply portion 100 to the one area of the source and drain areas of the drive transistor $TR_D$, the video signal $V_{Sig\_m}$ is applied to the gate electrode of the drive transistor $TR_D$. For this reason, as shown in FIG. 5, during [period-TP(2)$_4$], the potential on the second node $ND_2$ increases. The increased amount ($\Delta V$ shown in FIG. 5) of the potential will be described below. When the potential of the gate electrode of the drive transistor $TR_D$ (first node $ND_1$) is $V_g$, and the potential of the other area of the source and drain areas of the drive transistor $TR_D$ (second node $ND_2$) is $V_s$, if the increase in the potential on the second node $ND_2$ is not taken into consideration, the value $V_g$ and the value $V_s$ are as follows. The potential difference between the first node $ND_1$ and the second node $ND_2$, that is, the potential difference $V_{gs}$ between the gate electrode and the other area of the source and drain areas acting as a source area of the drive transistor $TR_D$ can be expressed by Equation (3).

$$V_g = V_{Sig\text{-}m}$$

$$V_s \cong V_{Ofs} - V_{th}$$

$$V_{gs} \cong V_{Sig\_m} - (V_{Ofs} - V_{th}) \quad (3)$$

That is, $V_{gs}$ obtained in the write processing to the drive transistor $TR_D$ depends on the video signal $V_{Sig\_m}$ for controlling luminance in the light-emitting portion ELP, the threshold voltage $V_{th}$ of the drive transistor $TR_D$, and the voltage $V_{Ofs}$ for initializing the potential of the gate electrode of the drive transistor $TR_D$. There is no relation between $V_{gs}$ and the threshold voltage $V_{th\text{-}EL}$ of the light-emitting portion ELP.

Next, the increase in the potential on the second node $ND_2$ during [period-TP(2)$_4$] will be described. In the driving method of the reference example, in the write processing, mobility correction processing is also performed for increasing the potential of the other area of the source and drain areas of the drive transistor $TR_D$ (that is, the potential on the second node $ND_2$) in accordance with the characteristics of the drive transistor $TR_D$ (for example, the magnitude of mobility μ and the like).

When the drive transistor $TR_D$ is a polysilicon thin film transistor or the like, it is difficult to avoid variation in mobility μ between the transistors. Accordingly, even when the video signals $V_{Sig}$ having the same value are respectively applied to the gate electrodes of a plurality of drive transistors $TR_D$ which are different in mobility μ, there is a difference between the drain current $I_{ds}$ flowing in the drive transistor $TR_D$ having large mobility μ and the drain current $I_{ds}$ flowing in the drive transistor $TR_D$ having small mobility μ. Such a difference causes deterioration in uniformity of the screen of the display apparatus.

In the driving method of the reference example, in a state where the drive voltage $V_{CC\text{-}H}$ is applied from the power supply portion 100 to the one area of the source and drain areas of the drive transistor $TR_D$, the video signal $V_{Sig\_m}$ is applied to the gate electrode of the drive transistor $TR_D$. For this reason, as shown in FIG. 5, during [period-TP(2)$_4$], the potential on the second node $ND_2$ increases. When the drive transistor $TR_D$ has large mobility μ, the increased amount $\Delta V$ (potential correction value) of the potential of the other area of the source and drain areas of the drive transistor $TR_D$ (that is, the potential on the second node $ND_2$) increases. To the contrary, when the drive transistor $TR_D$ has small mobility μ, the increased amount $\Delta V$ (potential correction value) of the potential of the other area of the source and drain areas of the drive transistor $TR_D$ decreases. The potential difference $V_{gs}$ between the gate electrode and the other area of the source and drain areas acting as a source area of the drive transistor $TR_D$ is transformed from Equation (3) into Equation (4).

$$V_{gs} \cong V_{Sig\_m} - (V_{Ofs} - V_{th}) - \Delta V \quad (4)$$

A predetermined time (in FIG. 5, the total time $t_0$ of [period-TP(2)$_4$]) for executing the write processing will be described below. It is assumed that the total time $t_0$ of [period-TP(2)$_4$] is determined such that the potential $(V_{Ofs}-V_{th}+\Delta V)$ of the other area of the source and drain areas of the drive transistor $TR_D$ satisfies Equation (2'). During [period-TP(2)$_4$], the light-emitting portion ELP does not emit light. With this mobility correction processing, variation in the coefficient $k(\equiv 1/2)\cdot(W/L)\cdot C_{ox})$ is corrected simultaneously.

$$(V_{Ofs}-V_{th}+\Delta V)<(V_{th\text{-}EL}+V_{Cat}) \quad (2')$$

[period-TP(2)$_5$] (see FIGS. 5 and 6F)

With the above-described operations, the steps (a) to (c) are completed. Thereafter, during [period-TP(2)$_5$], the step (d) is performed. That is, in a state where the drive voltage $V_{CC\text{-}H}$ is applied from the power supply portion 100 to the one area of the source and drain areas of the drive transistor $TR_D$, the scanning line SCL is at low level on the basis of the operation of the scanning circuit 101, the write transistor $TR_W$ is turned off, and the first node $ND_1$, that is, the gate electrode of the drive transistor $TR_D$ is set in the floating state. As a result, the potential on the second node $ND_2$ increases.

As described above, the gate electrode of the drive transistor $TR_D$ is in the floating state, and there is the capacitor portion $C_1$, so the same phenomenon as in a so-called bootstrap circuit occurs in the gate electrode of the drive transistor $TR_D$, and the potential on the first node $ND_1$ also increases. As a result, the potential difference $V_{gs}$ between the gate electrode and the other area of the source and drain areas acting as a source area of the drive transistor $TR_D$ is maintained at the value of Equation (4).

The potential on the second node $ND_2$ increases and exceeds $(V_{th-EL}+V_{Cat})$, so the light-emitting portion ELP starts to emit light. At this time, a current flowing in the light-emitting portion ELP is the drain current $I_{ds}$ flowing from the drain area of the drive transistor $TR_D$ to the source area. Thus, the current can be expressed by Equation (1). From Equations (1) and (4), Equation (1) can be transformed into Equation (5).

$$I_{ds}=k\cdot\mu\cdot(V_{Sig\_m}-V_{Ofs}-\Delta V)^2 \quad (5)$$

Therefore, for example, when $V_{Ofs}$ is set as 0 volt, the current $I_{ds}$ flowing in the light-emitting portion ELP is proportional to a square of a value obtained by subtracting the value of the potential correction value $\Delta V$ due to the mobility $\mu$ of the drive transistor $TR_D$ from the value of the video signal $V_{Sig\_m}$ for controlling luminance in the light-emitting portion ELP. In other words, the current $I_{ds}$ flowing in the light-emitting portion ELP does not depend on the threshold voltage $V_{th-EL}$ of the light-emitting portion ELP and the threshold voltage $V_{th}$ of the drive transistor $TR_D$. That is, the light-emission amount (luminance) of the light-emitting portion ELP is not influenced by the threshold voltage $V_{th-EL}$ of the light-emitting portion ELP and the threshold voltage $V_{th}$ of the drive transistor $TR_D$. Thus, luminance of the (n,m)th display device 10 corresponds to the relevant current $I_{ds}$.

As the drive transistor $TR_D$ has larger mobility $\mu$, the potential correction value $\Delta V$ increases, so the value of $V_{gs}$ on the right side of Equation (4) decreases. Thus, in Equation (5), even when the mobility $\mu$ is large, the value of $(V_{Sig\_m}-V_{Ofs}-\Delta V)^2$ decreases, and as a result, variation in the drain current $I_{ds}$ due to variation in mobility $\mu$ of the drive transistor $TR_D$ (in addition, variation in k) can be corrected. Therefore, variation in luminance of the light-emitting portion ELP due to variation in mobility $\mu$ (in addition, variation in k) can be corrected.

The light-emission state of the light-emitting portion ELP is continuously maintained until the (m+m'-1)th horizontal scanning period. The termination of the (m+m'-1)th horizontal scanning period corresponds to the termination of [period-TP(2)$_6$]. Here, "m'" is a predetermined value satisfying the relationship 1<m'<M in the display apparatus. In other words, the light-emitting portion ELP is driven from the commencement of [period-TP(2)$_5$] immediately before the (m+m')th horizontal scanning period $H_{m+m'}$, and this period becomes the light-emission period.

[period-TP(2)$_7$] (see FIG. 4)

Next, the light-emitting portion ELP is set in the non-light-emission state. Specifically, in a state where the write transistor $TR_W$ is maintained to be turned off, in the commencement of [period-TP(2)$_7$] (in other words, the commencement of the (m+m')th horizontal scanning period $H_{m+m'}$), a voltage which is supplied from the power supply portion 100 is changed from the voltage $V_{CC-H}$ to the voltage $V_{CC-L}$. As a result, the potential on the second node $ND_2$ decreases to $V_{CC-L}$, a backward voltage is applied between the anode electrode and the cathode electrode of the light-emitting portion ELP, and the light-emitting portion ELP is set in the non-light-emission state. The potential on the first node $ND_1$ (the gate electrode of the drive transistor $TR_D$) also decreases so as to follow the decrease in the potential on the second node $ND_2$.

The above-described non-light-emission state is maintained immediately before the m-th horizontal scanning period $H_m$ in the next frame. This time corresponds to immediately before the commencement of [period-TP(2)$_{+1}$] shown in FIG. 4. If the non-light-emission period is provided in such a manner, residual image blur due to active matrix drive can be reduced, and excellent motion image quality can be achieved. For example, if m' is set as M/2, the time length of each of the light-emission period and the non-light-emission period is substantially half of one display frame period.

Thus, the light-emission operation of the display device 10 constituting the (n,m) the subpixel is completed.

During [period-TP(2)$_{+1}$] and later, the same steps as described in [period-TP(2)$_1$] to [period-TP(2)$_7$] are repeatedly performed. That is, the [period-TP(2)$_7$] shown in FIG. 4 corresponds to the next [period-TP(2)$_0$].

The operation of the driving method of the reference example has been described. Here, the length of the optimum total time $t_0$ of [period-TP(2)$_4$] depends on the value of the video signal $V_{Sig}$. Qualitatively, control is preferably performed such that, as the value $V_{Sig\_m}$ decreases, [period-TP(2)$_4$] is extended. The relationship between the video signal $V_{Sig\_m}$ and the optimum total time $t_0$ will be described.

Figure 7A:
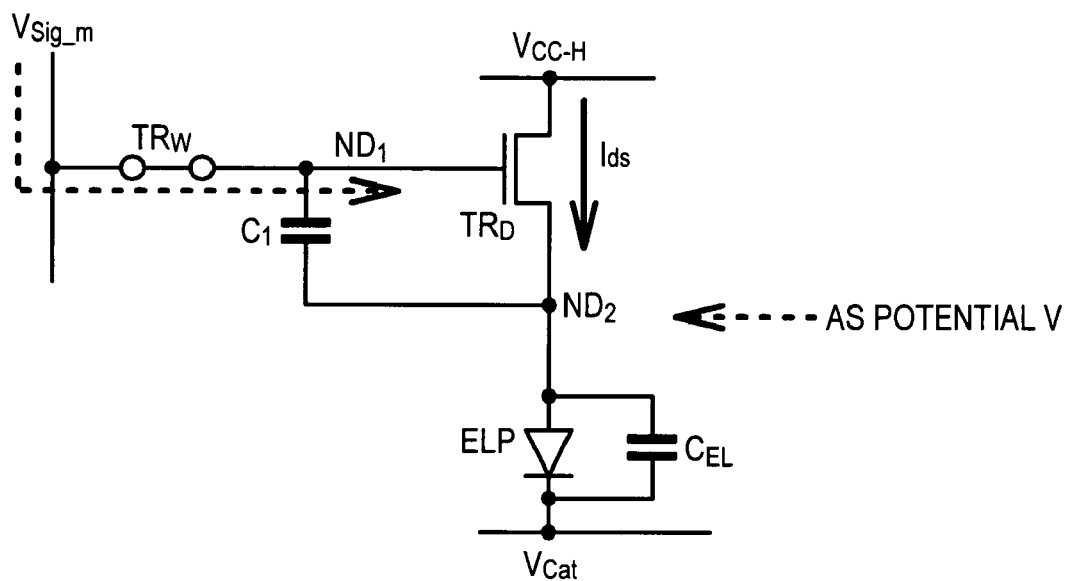
FIG. 7A is a schematic view of a drive circuit illustrating change in the potential on a second node.

As shown in FIG. 7A, during the [period-TP(2)$_4$], the drain current $I_{ds}$ flows into the second node $ND_2$, so the potential on the second node $ND_2$ increases. The potential on the second node $ND_2$ is represented by a variable V. The potential difference $V_{gs}$ between the gate electrode and the other area of the source and drain areas serving as a source area of the drive transistor $TR_D$ during the [period-TP(2)$_4$] is expressed by Equation (6).

$$V_{gs}=V_{Sig\_m}-V \quad (6)$$

The drain current $I_{ds}$ during the [period-TP(2)$_4$] is expressed by Equation (7) on the basis of Equations (1) and (6).

$$I_{ds}=k\cdot\mu\cdot(V_{Sig\_m}-V_{th}-V)^2 \quad (7)$$

Figure 7B:
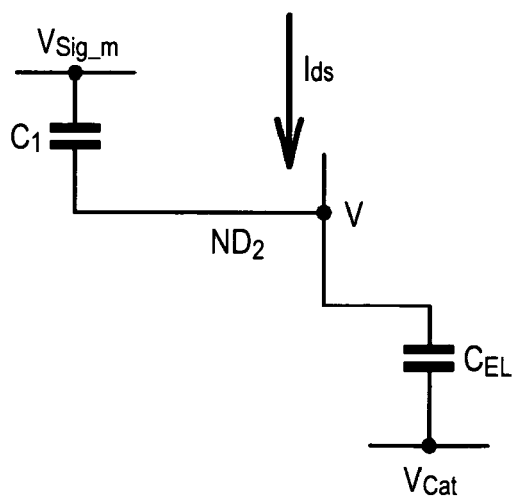
FIG. 7B is a schematic circuit diagram illustrating change in electric charges when a drain current flows in a second node.

The flow of the current based on Equation (7) increases electric charges of the capacitor portion $C_1$ and the capacitance $C_{EL}$ of the light-emitting portion ELP. As shown in FIG. 7B, one end of each of the capacitor portion $C_1$ and the capacitance $C_{EL}$ has a fixed potential. Therefore, when the total amount of electric charges of the capacitor portion $C_1$ and electric charges of the capacitance $C_{EL}$ is represented by a variable Q, and the total capacitance of the capacitor portion $C_1$ and the capacitance $C_{EL}$ is represented by $C_S$ (capacitance $C_S = c_1 + c_{EL}$), Equation (8) is established. Then, Equation (9) is obtained on the basis of Equation (8).

$$I_{ds}=dQ/dt=C_S\cdot dV/dt \quad (8)$$

$$dV/dt=(1/C_S)\cdot I_{ds} \quad (9)$$

Equation (10) is obtained on the basis of Equation (9) and Equation (7).

$$\int \frac{1}{C_S}dt = \int \frac{1}{k\cdot\mu\cdot(V_{Sig\_m}-V_{th}-V)^2}dV \quad (10)$$

In the commencement of [period-TP(2)$_4$], the potential on the second node $ND_2$ is "$V_{Ofs}-V_{th}$". Thus, when the integration period on the left side of Equation (10) is $[0,t_0]$, the integration period on the right side of Equation (10) becomes $[V_{Ofs}-V_{th},V]$. In addition, since $V_{Ofs}$ is set as 0 volt, the integration period on the right side of Equation (10) is [−$V_{th}$, V]. Both sides of Equation (10) are integrated for the above-described integration periods and arranged, thereby obtaining Equation (11). Then, Equation (12) is obtained on the basis of Equation (11) and Equation (7).

$$V_{Sig\_m} - V_{th} - V = \frac{V_{Sig\_m}}{1 + \frac{k \cdot \mu \cdot V_{Sig\_m} \cdot t_0}{C_S}} \tag{11}$$

$$I_{ds} = k \cdot \mu \cdot \left( \frac{V_{Sig\_m}}{1 + \frac{k \cdot \mu \cdot V_{Sig\_m} \cdot t_0}{C_S}} \right)^2 \tag{12}$$

The time $t_0$ satisfying the condition that the drain current $I_{ds}$ does not change even when the mobility μ changes is a suitable time $t_0$. Therefore, the time $t_0$ when Equation (12) is differentiated with mobility μ as a variable, and the resultant value becomes 0 is an optimum time $t_0$. When the time $t_0$ is obtained with $dI_{ds}/d\mu$=0, Equation (13) is obtained. Further, if Equation (13) is substituted into Equation (12), Equation (14) is obtained.

$$t_0 = C_S / (k \cdot \mu \cdot V_{Sig\_m}) \tag{13}$$

$$I_{ds} = k \cdot \mu \cdot (V_{Sig\_m}/2)^2 \tag{14}$$

Figure 8A:
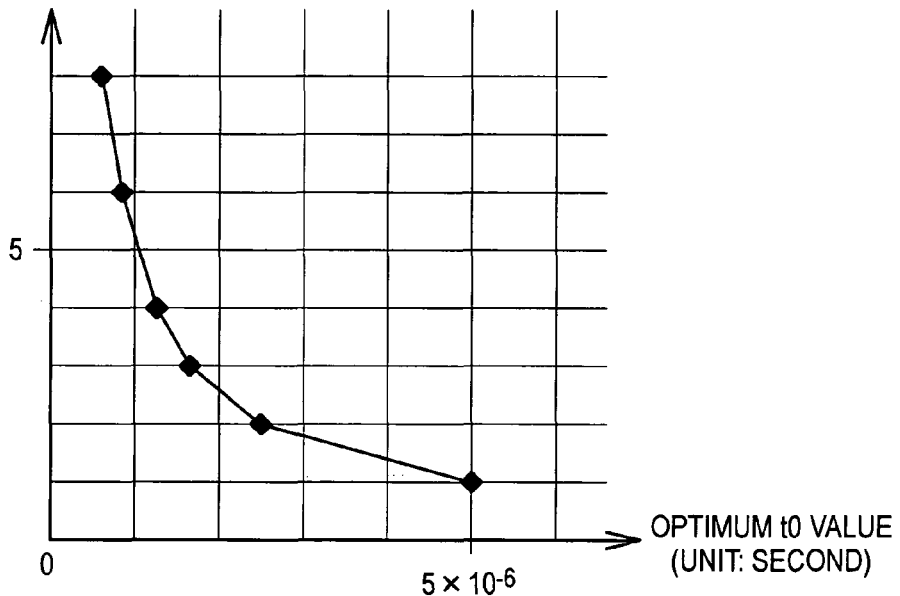
FIG. 8A is a graph illustrating a relationship between the value of a video signal and the value of an optimum time $t_0$.
Figure 8B:
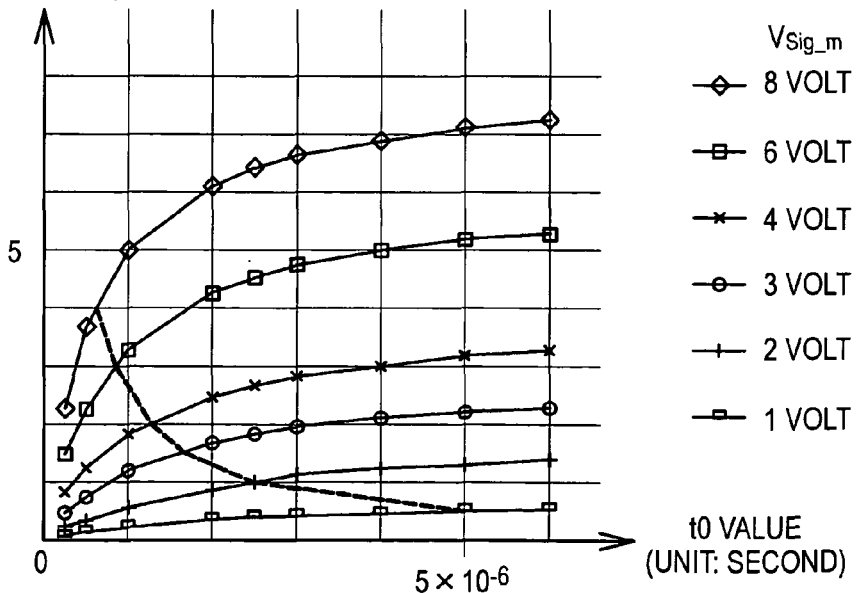
FIG. 8B is a graph showing a relationship between a potential correction value $\Delta V$ and a time $t_0$ for respective values of a video signal.

As will be apparent from Equation (13), qualitatively, control is preferably performed such that, as the value of the video signal $V_{Sig\text{-}m}$ decreases, [period-TP(2)$_4$] is extended. FIG. 8A shows a relationship between the value of the video signal $V_{Sig\_m}$ and the optimum time $t_0$ when the following values are set. FIG. 8B shows a relationship between the potential correction value ΔV and the time $t_0$ for the respective values of the video signal $V_{Sig\_m}$.
$C_s$=1.4 [unit: pF]
μ=40 [unit: cm$^2$/(V·s)]
k=5.9×10$^{-17}$ [unit: F/μm$^2$]

Since $V_{Ofs}$ is set as 0 volt, in Equation (5), $V_{Ofs}$ is 0, and the relationship $I_{ds}$=k·μ·($V_{Sig\_m}$−ΔV)$^2$ is established. In comparison of this equation and Equation (14), it can be seen that the optimum value of ΔV is $V_{Sig\_m}$/2. In other words, in the mobility correction processing, it is most preferable to increase the potential on the second node ND$_2$ by $V_{Sig\_m}$/2. A broken-line curve shown in FIG. 8B corresponds to a graph of FIG. 8A, and is obtained by connecting points where the potential correction value ΔV is $V_{Sig\_m}$/2.

For example, when the video signal $V_{Sig\_m}$ is 8 volts (white display), the optimum value of the time $t_0$ is about 0.6×10$^{-6}$ (second). Meanwhile, when the video signal $V_{Sig\_m}$ is 1 volt (black display), the optimum value of the time $t_0$ is about 5×10$^{-6}$ (second). In this way, in the driving method of the reference example, the optimum value of the time $t_0$ significantly changes depending on the value of the video signal $V_{Sig\_m}$. If the write transistor TR$_W$ can be driven so as to change the length of [period-TP(2)$_4$] in FIG. 4 in accordance with the value of the video signal $V_{Sig\_m}$, mobility correction can be favorably performed. As described below, in the write processing, the falling edge of the scanning signal applied to the gate electrode of the write transistor TR$_W$ is inclined, such that the length of [period-TP(2)$_4$] can be changed in accordance with the value of the video signal $V_{Sig\_m}$.

However, with an increase in the size or high definition of the display apparatus, or double-speed driving for image quality improvement, the horizontal scanning period is shortened. Thus, [period-TP(2)$_4$] is a period within one horizontal scanning period. For this reason, in the display apparatus in which the horizontal scanning period is set short, if the maximum length of [period-TP(2)$_4$] is limited to, for example, about 1×10$^{-6}$ (second) in terms of design, when the value of the video signal $V_{Sig\_m}$ is equal to or smaller than 3 volts, mobility correction may not be favorably performed. As described, according to the driving method of the reference example, there is a problem in that, in the display apparatus in which the horizontal scanning period is set short, it is difficult to favorably perform the mobility correction.

As described above, in the driving method of the reference example, during [period-TP(2)$_4$], only the video signal $V_{Sig\_m}$ is applied to the data line DTL. In contrast, in the driving method of Example 1, during [period-TP(2)$_4$], the auxiliary video signal $V_{Pre\_m}$ is first applied to the data line DTL, and then the video signal $V_{Sig\_m}$, instead of the auxiliary video signal $V_{Pre\_m}$, is applied. This is a difference between the driving method of Example 1 and the driving method of the reference example. For convenience, the auxiliary video signal corresponding to the (n,m)th subpixel is represented by $V_{Pre\_m}$. The same is applied to other auxiliary video signals.

In the driving method of Example 1, during [period-TP(2)$_4$], the voltage based on the auxiliary video signal $V_{Pre}$ and the voltage based on the video signal $V_{Sig}$ are applied from the data line DTL to the first node ND$_1$ through the write transistor TR$_W$ which is turned on in response to the scanning signal from the scanning line SCL.

FIG. 9 schematically shows a relationship between the potential of the data line DTL, the potential of the scanning line SCL, the state of the drive transistor TR$_D$, the potential on the first node ND$_1$, and the potential on the second node ND$_2$ in the horizontal scanning period H$_m$ including [period-TP(2)$_4$] shown in FIG. 4. FIGS. 10A and 10B schematically show the on/off states and the like of the respective transistors constituting the display device 10 of the drive circuit 11 in [period-TP(2)$_4$] shown in FIG. 4. FIG. 10C is a graph illustrating a relationship between the potential correction value ΔV$_{Sig\_m}$ and the time $t_{Sig}$ shown in FIG. 9. Hereinafter, the driving method of Example 1 will be described with reference to FIGS. 4, 9, and 10A to 10C.

In Example 1, the auxiliary video signal $V_{Pre}$ has a predetermined value higher than the minimum value (1 volt) of the video signal $V_{Sig}$. Specifically, the auxiliary video signal $V_{Pre}$ has the same value (8 volt) as the maximum value of the video signal $V_{Sig}$.

In the driving method of Example 1, the step (c) among the steps (a) to (d) described in the reference example is replaced. That is, instead of the step (c) in the reference example, write processing is performed for applying the auxiliary video signal $V_{Pre}$ to the data line DTL, then, applying the video signal $V_{Sig}$, instead of the auxiliary video signal $V_{Pre}$, to the data line DTL, and in a state where the predetermined drive voltage $V_{CC\text{-}H}$ is applied from the power supply portion 100 to the one area of the source and drain areas of the drive transistor TR$_D$, applying the voltage based on the auxiliary video signal $V_{Pre}$ and the voltage based on the video signal $V_{Sig}$ from the data line DTL to the first node ND$_1$ through the write transistor TR$_W$ which is turned on in response to the scanning signal from the scanning line SCL. The operation of the driving method of Example 1 during the periods other than [period-TP(2)$_4$] is basically the same as the operation of the driving method of the reference example.

[period-TP(2)$_0$] to [period-TP(2)$_2$] (see FIGS. 4 and 9)

The operation during these periods is the same as the operation during [period-TP(2)] to [period-TP(2)$_2$] of the reference example, and description will not be repeated.

[period-TP(2)$_3$] (see FIGS. 4 and 9)

In the commencement of [period-TP(2)$_3$], the write transistor TR$_W$ is turned off in response to the scanning signal from the scanning line SCL. The voltage which is applied to the data line DTL is changed from the first node initialization voltage V$_{Ofs}$ to the auxiliary video signal V$_{Pre\_m}$ (video signal period). In the threshold voltage cancel processing, if the drive transistor TR$_D$ reaches the off state, substantially, the potential on the first node ND$_1$ and the second node ND$_2$ does not change. In the threshold voltage cancel processing, when the drive transistor TR$_D$ does not reach the off state, during [period-TP(2)$_3$], a bootstrap operation occurs, and the potential on the first node ND$_1$ and the second node ND$_2$ slightly increases. With regard to the on/off states and the like of the respective transistors constituting the drive circuit 11 of the display device 10, in FIG. 6D, V$_{Sig\_m}$ is replaced with V$_{Pre\_m}$.

[period-TP(2)$_4$] (see FIGS. 4, 9, 10A and 10B)

Within this period, the write processing is performed for applying the voltage based on the auxiliary video signal V$_{Pre\_m}$ and the voltage based on the video signal V$_{Sig\_m}$ from the data line DTL to the first node ND$_1$.

The write transistor TR$_W$ is turned on in response to the scanning signal from the scanning line SCL. Then, the auxiliary video signal V$_{Pre\_m}$ is applied from the data line DTL to the first node ND$_1$ through the write transistor TR$_W$ (see FIG. 10A). As a result, the potential on the first node ND$_1$ increases toward V$_{Pre\_m}$ (see FIG. 9). The potential on the first node ND$_1$ also increases. The increased amount of the potential of the first node ND$_1$ at this time is represented by a potential correction value $\Delta$V$_{Pre\_m}$.

Between the commencement and termination of [period-TP(2)$_4$], the signal which is applied to the data line DTL is changed from the auxiliary video signal V$_{Pre\_m}$ to the video signal V$_{Sig\_m}$ (see FIG. 10B). As a result, the potential on the first node ND$_1$ changes toward V$_{Sig\_m}$. The potential on the first node ND$_1$ continuously increases. The increased amount of the potential on the first node ND$_1$ at this time is represented by a potential correction value $\Delta$V$_{Sig\_m}$.

As shown in FIG. 9, in the driving method of Example 1, the potential correction value $\Delta$V is represented by the sum of the potential correction value $\Delta$V$_{Pre\_m}$ and the potential correction value $\Delta$V$_{Sig\_m}$. Hereinafter, description will be provided assuming that the value of the potential correction value $\Delta$V$_{Pre\_m}$ is set as 0.3 volt in terms of design. The value of the auxiliary video signal V$_{Pre\_m}$ is 8 volts, so from a curve of V$_{Sig\_m}$=8 volt shown in FIG. 8B, it can be seen that the voltage based on the auxiliary video signal V$_{Pre\_m}$ is preferably applied to the first node ND$_1$ for about $0.1 \times 10^{-6}$ seconds. In FIG. 9, symbol t$_{Pre}$ represents the length of the time for which the voltage based on the auxiliary video signal V$_{Pre\_m}$ is applied to the first node ND$_1$.

In the driving method of Example 1, the relationship $\Delta V = \Delta V_{Pre} + \Delta V_{Sig}$ is established. Further, as described above, the relationship optimum $\Delta V = V_{Sig\_m}/2$ is established. Therefore, the optimum value of $\Delta V_{Sig}$ becomes $V_{Sig\_m}/2 - 0.3$ (volt).

When V$_{Sig\_m}$ is 1 volt, the optimum value of $\Delta V_{Sig}$ is 0.2 volt. From a curve of V$_{Sig\_m}$=1 volt shown in FIG. 8B, it can be seen that the voltage based on the video signal V$_{Sig\_m}$ is preferably applied to the first node ND$_1$ for about $1 \times 10^{-6}$ seconds. In FIG. 9, the time t$_{Sig}$ represents the length of the period for which the voltage based on the video signal V$_{Sig\_m}$ is applied to the first node ND$_1$. The broken-line curve of FIG. 10C shows the time t$_{Sig}$ necessary for obtaining the optimum potential correction value $\Delta$V$_{Sig\_m}$ when the value of the potential correction value $\Delta$V$_{Pre\_m}$ is set as 0.3 volt in terms of design.

With regard to the time t$_0$ at which the write processing is performed, the relationship t$_0$=t$_{Pre}$+t$_{Sig}$ is established. Therefore, in the driving method of Example 1, even when the maximum length of [period-TP(2)$_4$] is limited to, for example, about $1 \times 10^{-6}$ (second) in terms of design, favorable mobility correction processing can be performed.

Figure 11:
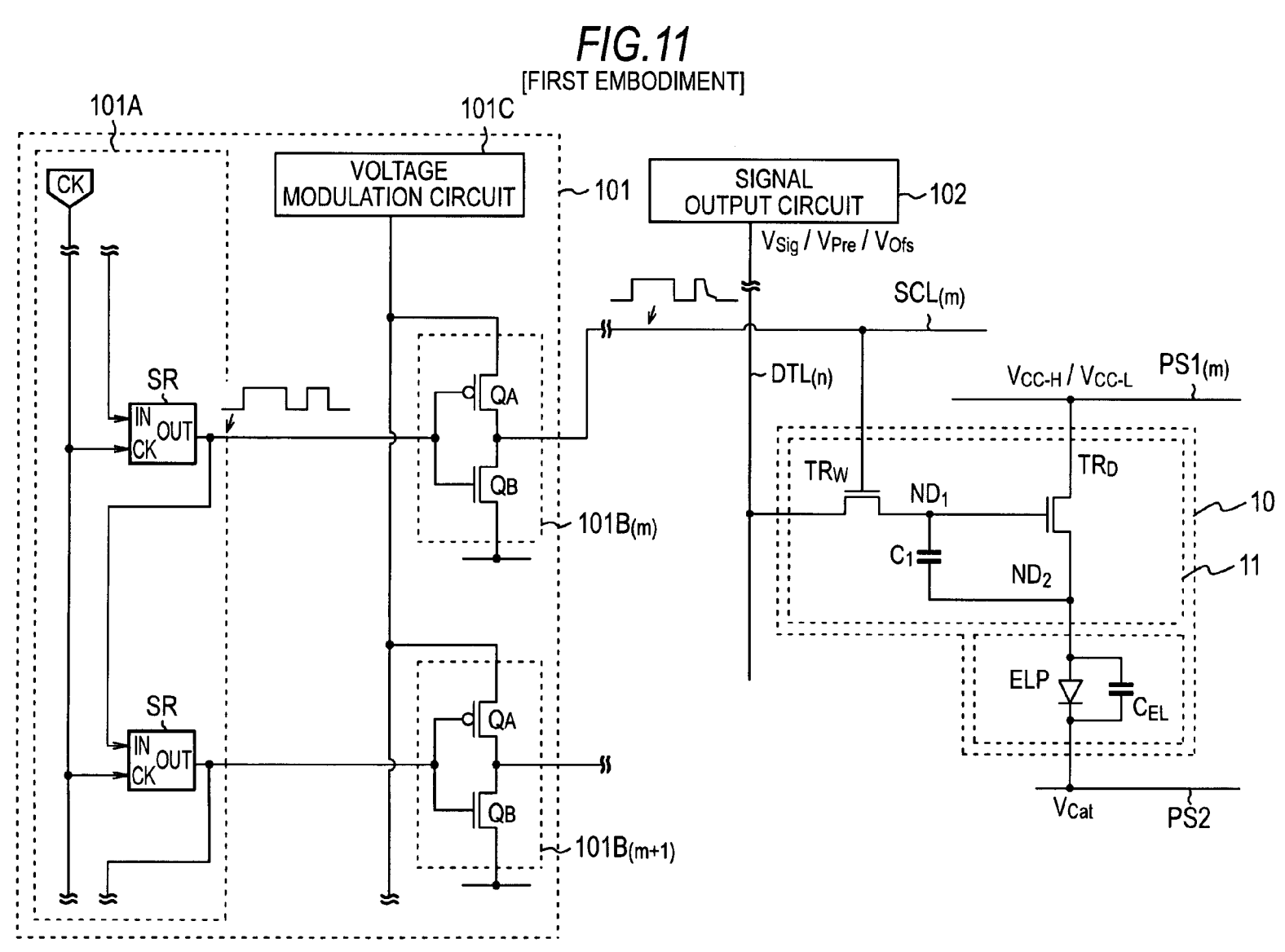

When the threshold voltage of the write transistor TR$_W$ is represented by V$_{th\_TRw}$, in the commencement of [period-TP(2)$_4$], the potential of the scanning line SCL falls below V$_{Sig\_m}$+V$_{th\_TRw}$. As shown in FIG. 9, in the write processing, the falling edge of the scanning signal applied to the gate electrode of the write transistor TR$_W$ is inclined, and in the write processing, the termination of the period in which the voltage based on the video signal V$_{Sig\_m}$ is applied from the data line DTL to the first node ND$_1$ is adjusted so as to be delayed as the value of the video signal V$_{Sig\_m}$ is lower. For example, as shown in FIG. 11, a signal from a shift register portion 101A constituting the scanning circuit 101 is input to a level shift circuit 101B. Then, a voltage modulation circuit 101C connected to the level shift circuit 101B modulates the voltage supplied to the level shift circuit 101B, such that the falling edge of the scanning signal is inclined.

As indicated by a broken line of FIG. 100, the difference $\Delta$t$_{Sig}$ between the value of the optimum time t$_{Sig}$ when the video signal V$_{Sig\_m}$ is 8 volts and the value of the optimum time t$_{Sig}$ when the video signal V$_{Sig\_m}$ is 1 volt is merely about $0.5 \times 10^{-6}$ (second). Therefore, in the driving method of Example 1, the falling edge of the scanning signal can be inclined steeply, as compared with the driving method of the reference example. The inclination of the falling edge of the scanning signal to such an extent can be formed by using dullness of the waveform occurring when a rectangular-wave scanning signal propagates the scanning line SCL. Therefore, the voltage modulation circuit 101C and the like shown in FIG. 11 can be removed.

Figure 12:
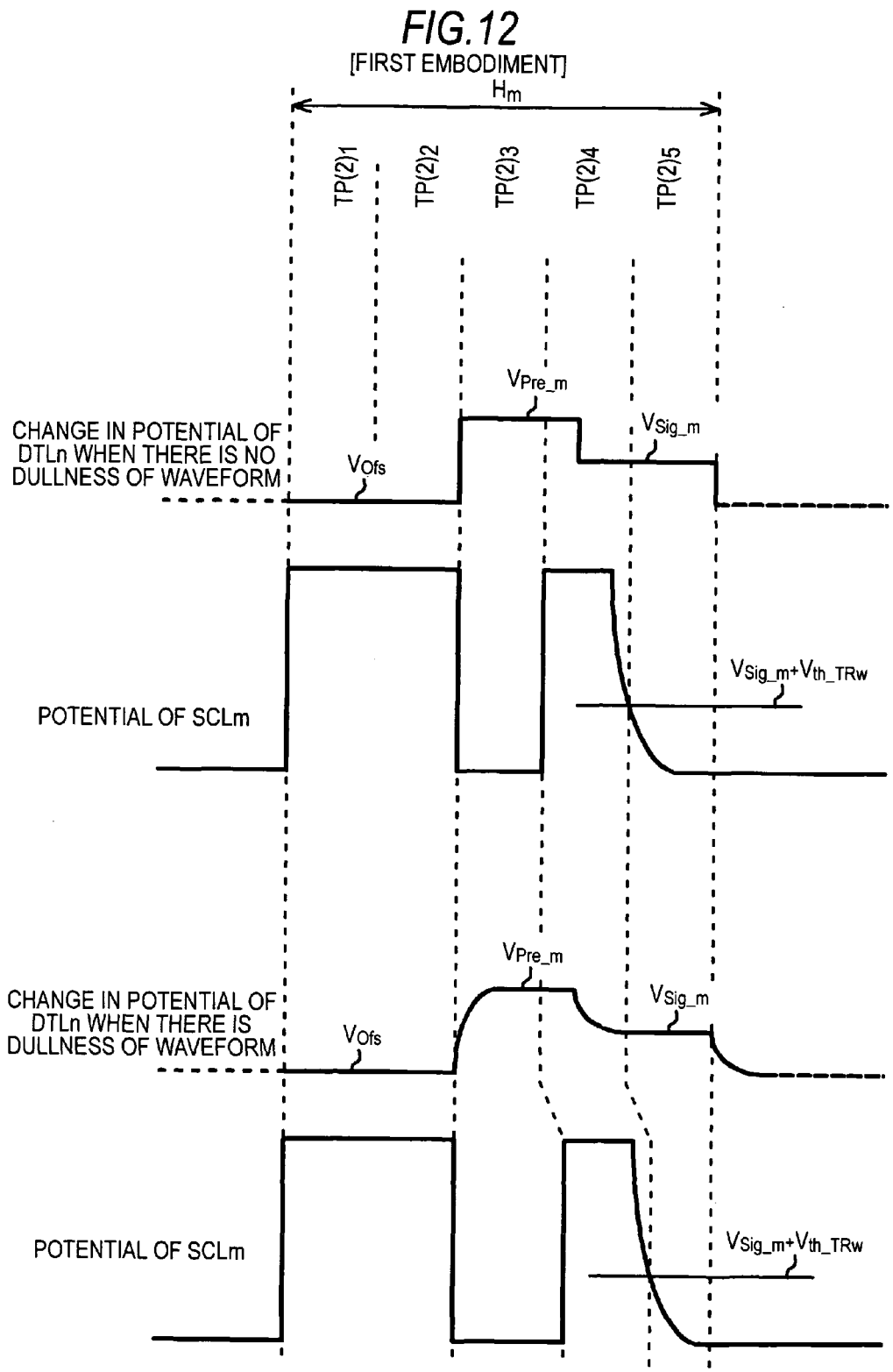
FIG. 12 is a schematic view illustrating setting of a scanning signal taking into consideration dullness of a waveform of change in the potential of a data line.

The driving method of Example 1 has been described. With regard to a signal propagating the data line DTL, as shown in FIG. 12, actually, there is dullness in the rising edge or the falling edge of the waveform. The timing of the scanning signal and the signal of the data line DTL may be appropriately set in accordance with design of the display apparatus while taking into consideration dullness of the waveform. The application of the signal when being changed from the auxiliary video signal to the video signal from the data line DTL to the first node corresponds to the application of the voltage based on the auxiliary video signal and the voltage based on the video signal from the data line DTL to the first node.

Example 2

Example 2 relates to the display apparatus and the method of driving a display apparatus according to the embodiment of the invention. Example 2 is a modification of Example 1. Example 2 is different from Example 1 in that, in Example 2, the value of the auxiliary video signal is set in accordance with the value of the video signal.

The configuration of the display apparatus for use in Example 2 is the same as the configuration of the display apparatus described in Example 1, and the values of various kinds of voltage or potential are the same as the values described in Example 1, excluding the value of the auxiliary video signal. The description thereof will not be repeated. In the driving method of Example 2, the drive timing charts are the same as in FIG. 4, except that the value of the auxiliary video signal is set on the basis of the value of the video signal.

In Example 1, the description has been made for a case where, when the value of the auxiliary video signal V$_{Pre}$ is fixed at 8 volts, the difference $\Delta t_{Sig}$ between the value of the optimum time $t_{Sig}$ when the video signal $V_{Sig\_m}$ is 8 volts and the value of the optimum time $t_{Sig}$ when the video signal $V_{Sig\_m}$ is 1 volt is about $0.5 \times 10^{-6}$ (second).

As can be understood from FIG. 10C in Example 1, for example, if the optimum value of $\Delta V_{Sig}$ when the video signal $V_{Sig\_m}$ is 8 volts becomes relatively higher, and the optimum value of $\Delta V_{Sig}$ when the video signal $V_{Sig\_m}$ is 1 volt becomes relatively lower, the difference $\Delta t_{Sig}$ further decreases. As described in Example 1, the optimum value of $\Delta V_{Sig}$ is $\Delta V_{Sig} = V_{Sig\_m}/2 - \Delta V_{Pre}$.

Figure 13:
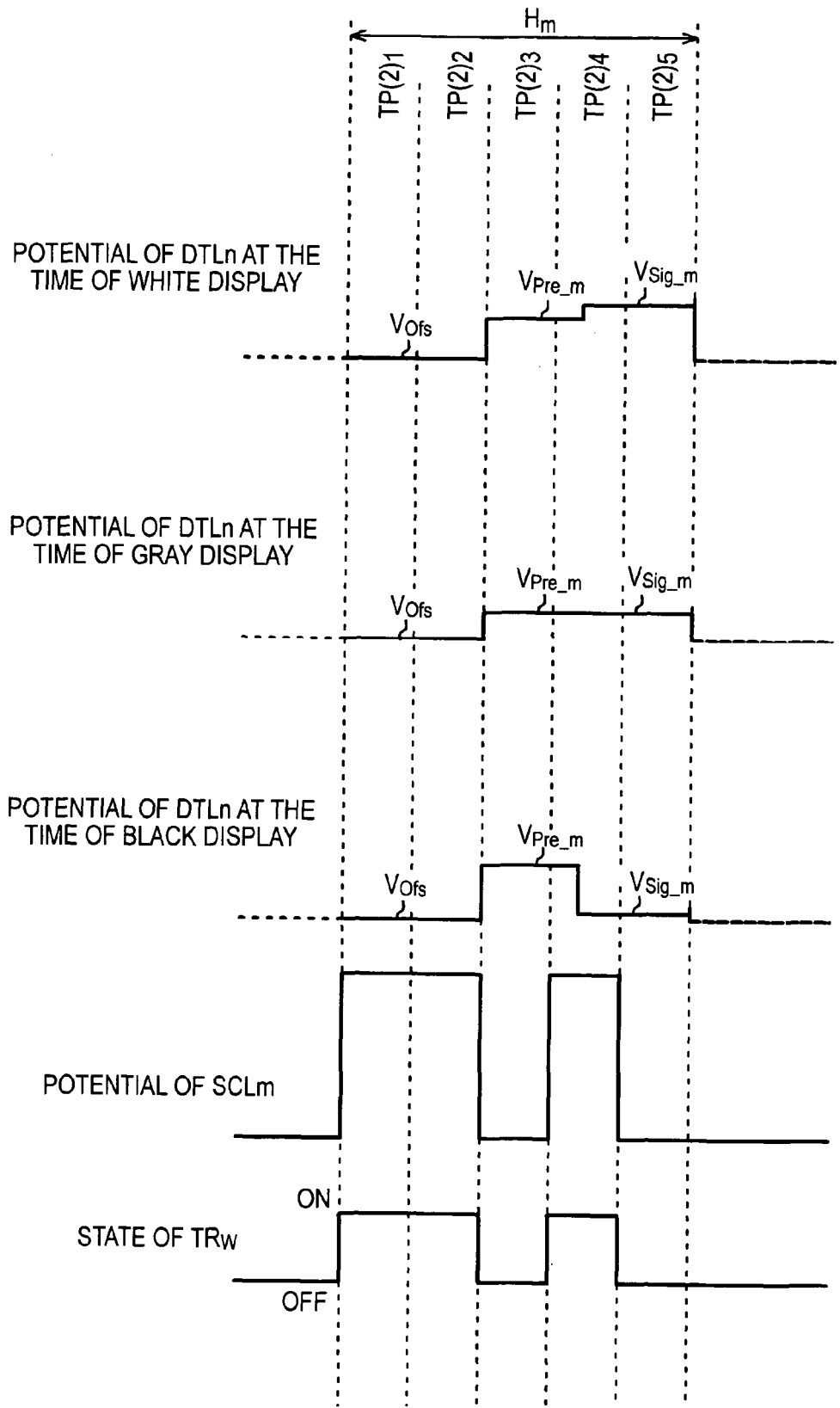
FIG. 13 is a schematic view illustrating a potential of a data line at the time of white display, a potential of a data line at the time of gray display, and a potential of a data line at the time of black display according to Example 2.

Therefore, if the value of the auxiliary video signal $V_{Pre}$ is set in accordance with the value of the video signal $V_{Sig}$, the difference $\Delta t_{Sig}$ can be further decreased. Specifically, as shown in FIG. 13, the value of the auxiliary video signal $V_{Pre\_m}$ may be set such that, in a white display state, the value of the auxiliary video signal $V_{Pre\_m}$ is lower than the value of the video signal $V_{Sig\_m}$, and in a black display state, the value of the auxiliary video signal $V_{Pre\_m}$ is higher than the value of the video signal $V_{Sig\_m}$. In a gray display state, the value of the auxiliary video signal $V_{Pre\_m}$ may be set such that balance is appropriately obtained. Therefore, the optimum length of [period-TP(2)$_4$.] can be set substantially uniform regardless of the value of the video signal $V_{Sig\_m}$. The correspondence relationship between the value of the video signal $V_{Sig\_m}$ and the value of the auxiliary video signal $V_{Pre\_m}$ may be appropriately set in accordance with design and the like of the display apparatus.

Although the invention has been described on the basis of the preferred examples, the invention is not limited to the examples. The configuration and structure of the display apparatus or display device, and the steps in the method of driving a display apparatus in the respective examples are for illustration and may be appropriately changed.

Figure 14:
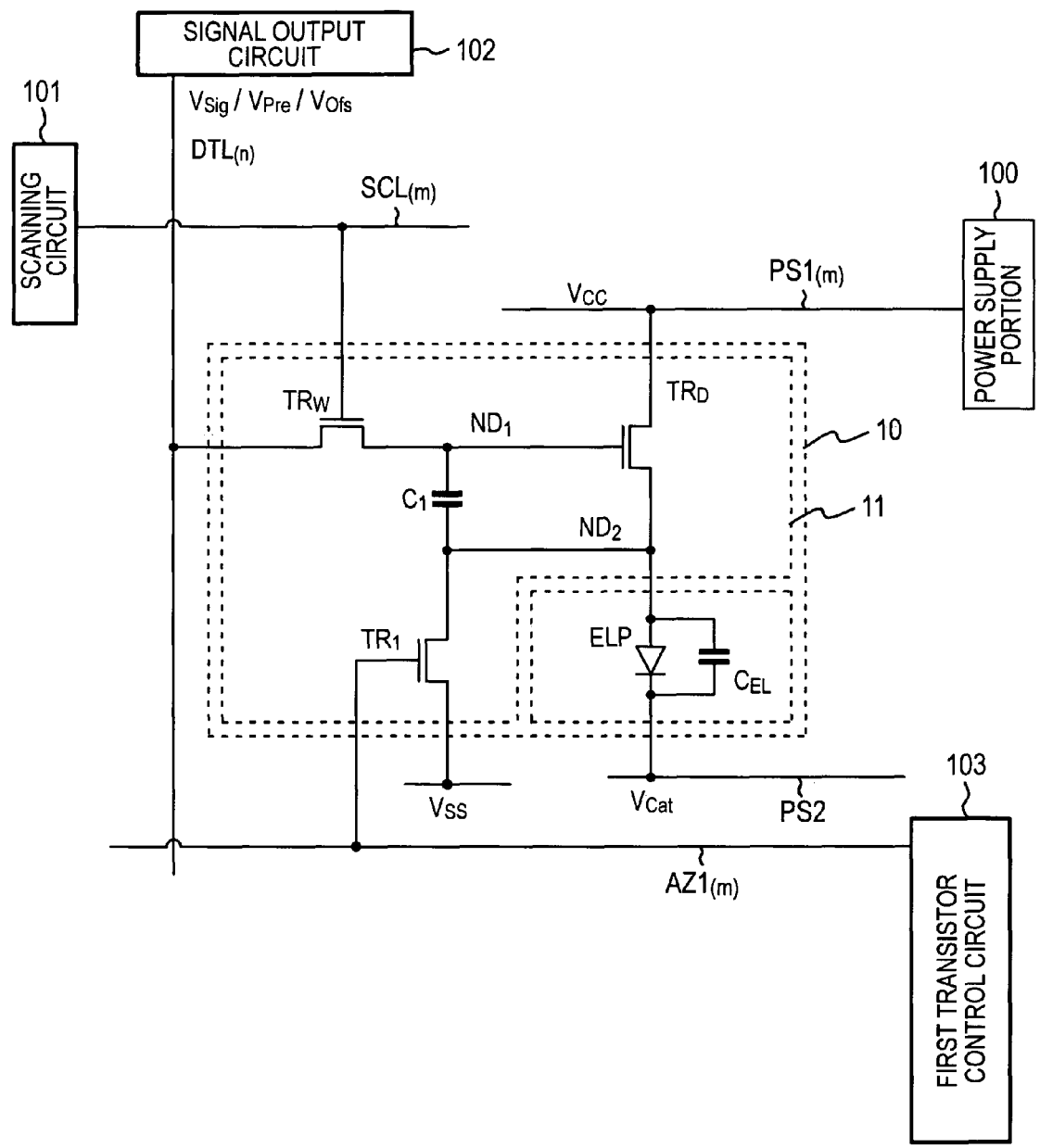
FIG. 14 is an equivalent circuit diagram of a display device including a drive circuit.

For example, as shown in FIG. 14, the drive circuit 11 constituting the display device 10 may include a transistor (first transistor $TR_1$) connected to the second node $ND_2$. In the first transistor $TR_1$, the second node initialization voltage $V_{SS}$ is applied to one area of the source and drain areas, and the other area of the source and drain areas is connected to the second node $ND_2$. A signal from a first transistor control circuit 103 is applied to the gate electrode of the first transistor $TR_1$ through a first transistor control line AZ1 to control the on/off state of the first transistor $TR_1$. Therefore, the potential on the second node $ND_2$ can be set.

Figure 15:
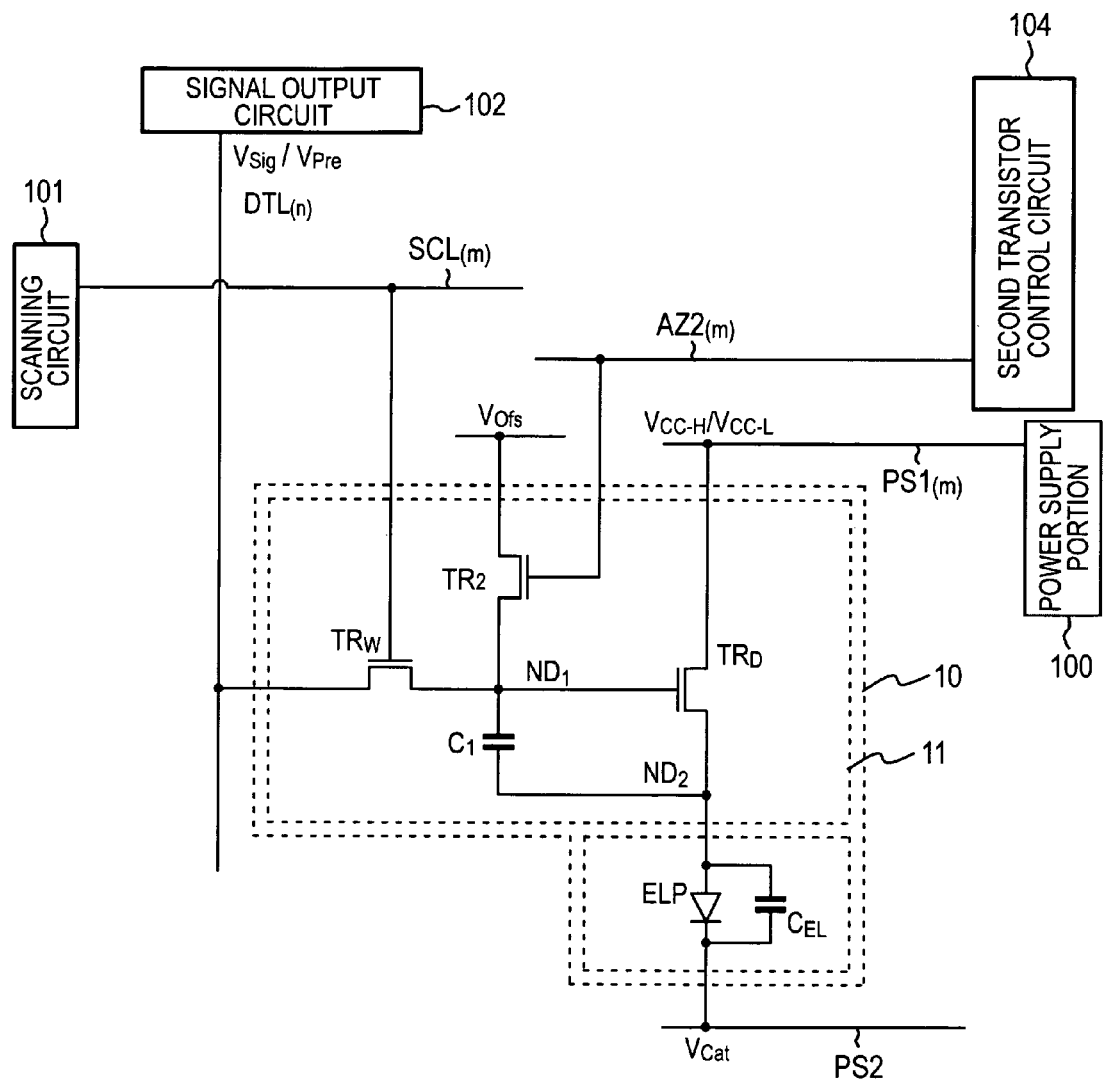
FIG. 15 is an equivalent circuit diagram of a display device including a drive circuit.

Alternatively, as shown in FIG. 15, the drive circuit 11 constituting the display device 10 may include a transistor (second transistor $TR_2$) connected to the first node $ND_1$. In the second transistor $TR_2$, the first node initialization voltage $V_{Ofs}$ is applied to one area of the source and drain areas, and the other area of the source and drain areas is connected to the first node $ND_1$. A signal from a second transistor control circuit 104 is applied to the gate electrode of the second transistor $TR_2$ through a second transistor control line AZ2 to control the on/off state of the second transistor $TR_2$. Therefore, the potential on the first node $ND_1$ can be set.

Figure 16:
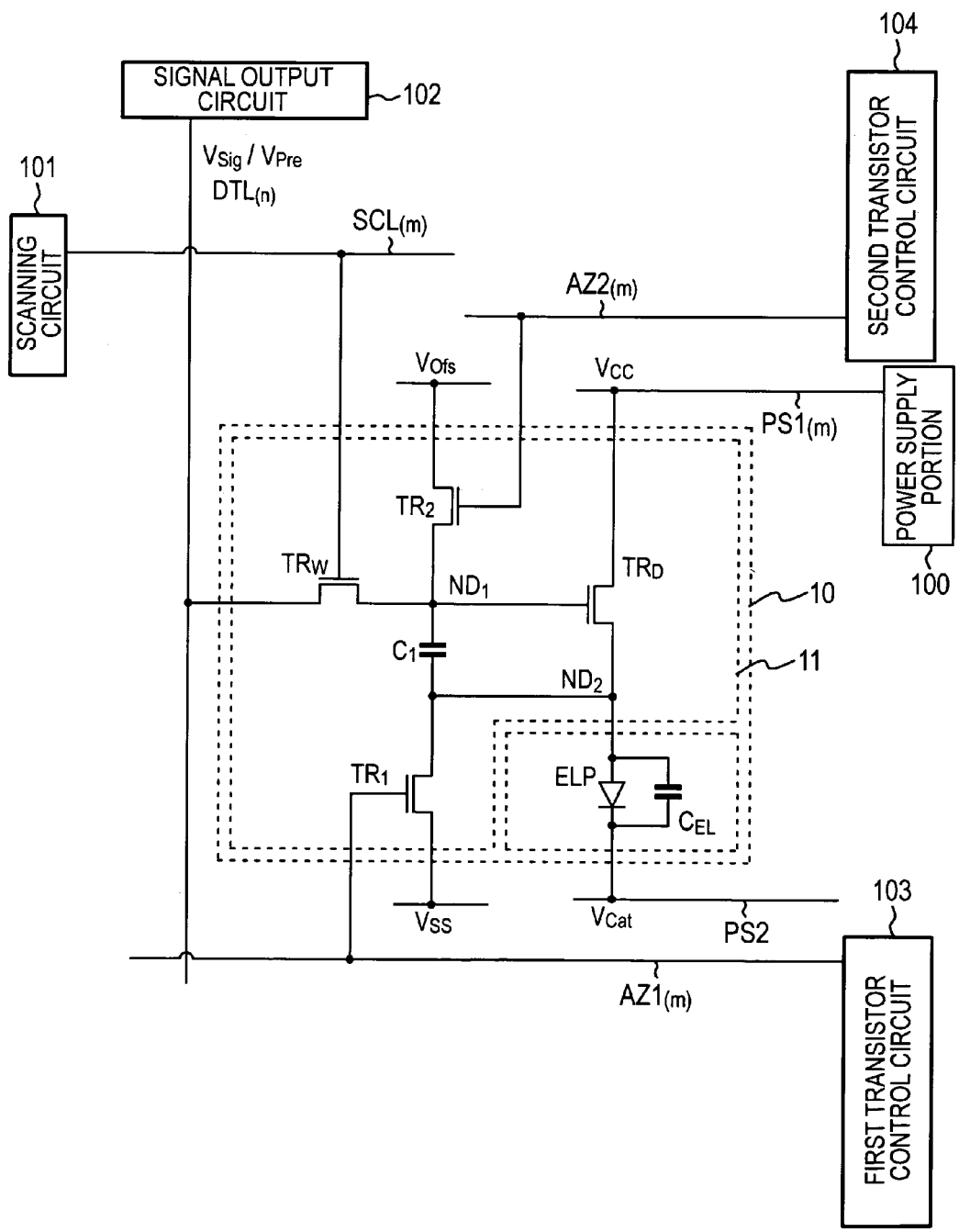
FIG. 16 is an equivalent circuit diagram of a display device including a drive circuit.

In addition, as shown in FIG. 16, the drive circuit 11 constituting the display device 10 may include both the first transistor $TR_1$ and the second transistor $TR_2$. In addition to the first and second transistors $TR_1$ and $TR_2$, an additional transistor may be provided.

The present application contains subject matter related to that disclosed in Japanese Priority Patent Application JP 2009-059326 filed in the Japan Patent Office on Mar. 12, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of driving a display apparatus, wherein the display apparatus includes a scanning circuit, a signal output circuit, a plurality of scanning lines which are connected to the scanning circuit and extend in a first direction, a plurality of data lines which are connected to the signal output circuit and extend in a second direction different from the first direction, display devices which are arranged in a two-dimensional matrix, and display device having a current-driven light-emitting portion and a drive circuit, and a power supply portion, the drive circuit including a write transistor, a drive transistor, and a capacitor portion, a first current terminal of the write transistor being connected to a corresponding data line and a gate electrode of the write transistor being connected to a corresponding scanning line, a first current terminal of the drive transistor being connected to the power supply portion, a second current terminal of the drive transistor being connected to an anode electrode of the light-emitting portion and being connected a first electrode of the capacitor portion at a second node, and a gate electrode of the drive transistor being connected to a second current terminal of the write transistor and being connected to a second electrode of the capacitor portion at a first node, the method comprising:

performing write processing that includes applying an auxiliary video signal to the corresponding data line, then applying a video signal to the corresponding data line, the auxiliary video signal being distinct from the video signal and having a predetermined voltage that is distinct from a power supply potential, and in a state where a predetermined drive voltage is applied from the power supply portion to the first current terminal of the drive transistor, applying the predetermined voltage of the auxiliary video signal and a voltage of the video signal from the corresponding data line to the first node, through the write transistor while the write transistor is turned on in response to a scanning signal from the corresponding scanning line, the predetermined voltage of the auxiliary signal being set to reduce an amount of time required for the voltage of the video signal to be provided at the first node during the write processing.

2. The method according to claim 1, wherein the predetermined voltage of the auxiliary video signal has a predetermined value higher than a minimum value of the video signal.

3. The method according to claim 2, wherein the predetermined voltage of the auxiliary video signal has the same value as a maximum value of the video signal.

4. The method according to claim 1, wherein the predetermined voltage of the auxiliary video signal is set in accordance with the value of the video signal.

5. The method according to claim 1, wherein, prior to the write processing, preprocessing is performed for initializing a potential on the first node and a potential on the second node such that a potential difference between the gate electrode of the drive transistor and the second current terminal of the drive transistor exceeds a threshold voltage of the drive transistor, and a potential difference between the second current terminal of the drive transistor and a cathode electrode provided in the light-emitting portion does not exceed a threshold voltage of the light-emitting portion, and then threshold voltage cancel processing is performed for changing the potential on the second current terminal of the drive transistor toward a potential obtained by subtracting the threshold voltage of the drive transistor from the potential on the first node in a state where the potential on the gate electrode of the drive transistor is maintained.

6. The method according to claim 1, wherein, after the write processing, the write transistor is turned off in response to the scanning signal from the scanning line to set the gate electrode of the drive transistor in a floating state, and in a state where the predetermined drive voltage is applied from the power supply portion to the first current terminal of the drive transistor, a current according to the value of a potential difference between the gate electrode and the second current terminal of the drive transistor flows in the light-emitting portion through the drive transistor, thereby driving the light-emitting portion.

7. The method according to claim 1, wherein the light-emitting portion is an organic electroluminescence light-emitting portion.

8. A display apparatus comprising:
a scanning circuit;
a signal output circuit;
a plurality of scanning lines which are connected to the scanning circuit and extend in a first direction;
a plurality of data lines which are connected to the signal output circuit and extend in a second direction different from the first direction;
display devices which are arranged in a two-dimensional matrix, each having a current-driven light-emitting portion and a drive circuit; and
a power supply portion,
wherein the drive circuit includes a write transistor, a drive transistor, and a capacitor portion,
a first current terminal of the write transistor is connected to a corresponding data line and a gate electrode of the write transistor is connected to a corresponding scanning line,
a first current terminal of the drive transistor is connected to the power supply portion, a second current terminal of the drive transistor is connected to an anode electrode provided in the light-emitting portion and connected to a first electrode of the capacitor portion at a second node, and a gate electrode of the drive transistor is connected to the second current terminal of the write transistor and connected to a second electrode of the capacitor portion at a first node, wherein
during a write processing an auxiliary video signal is applied to the corresponding data line, then a video signal is applied to the corresponding data line, the auxiliary video signal being distinct from the video signal and having a predetermined voltage that is distinct from a power supply potential, and in a state where a predetermined drive voltage is applied from the power supply portion to the first current terminal of the drive transistor, the predetermined voltage of the auxiliary video signal and a voltage of the video signal are applied from the corresponding data line to the first node, through the write transistor while the write transistor is turned on in response to a scanning signal from the corresponding scanning line, the predetermined voltage of the auxiliary signal being set to reduce an amount of time required for the voltage of the video signal to be provided at the first node during the write processing.

9. The display apparatus according to claim 8, wherein the predetermined voltage of the auxiliary video signal has a predetermined value higher than a minimum value of the video signal.

10. The display apparatus according to claim 9, wherein the predetermined voltage of the auxiliary video signal has the same value as a maximum value of the video signal.

11. The display apparatus according to claim 8, wherein the predetermined voltage of the auxiliary video signal is set in accordance with the value of the video signal.

12. The display apparatus according to claim 11, wherein the predetermined voltage of the auxiliary signal is one of a plurality of predetermined voltages, a first predetermined voltage of the auxiliary signal being set lower than the value of the video signal in a white display state, a second predetermined voltage of the auxiliary signal being set higher than the value of the video signal in a black display state.

13. The display apparatus method according to claim 8, wherein, prior to the write processing, preprocessing is performed for initializing a potential on the first node and a potential on the second node such that a potential difference between the gate electrode of the drive transistor and the second current terminal of the drive transistor exceeds a threshold voltage of the drive transistor, and a potential difference between the second current terminal of the drive transistor and a cathode electrode provided in the light-emitting portion does not exceed a threshold voltage of the light-emitting portion, and then threshold voltage cancel processing is performed for changing the potential on the second current terminal of the drive transistor toward a potential obtained by subtracting the threshold voltage of the drive transistor from the potential on the first node in a state where the potential on the gate electrode of the drive transistor is maintained.

14. The display apparatus according to claim 8, wherein, after the write processing, the write transistor is turned off in response to the scanning signal from the scanning line to set the gate electrode of the drive transistor in a floating state, and in a state where the predetermined drive voltage is applied from the power supply portion to the first current terminal of the drive transistor, a current according to the value of a potential difference between the gate electrode and the second current terminal of the drive transistor flows in the light-emitting portion through the drive transistor, thereby driving the light-emitting portion.

15. The display apparatus according to claim 8, wherein the light-emitting portion is an organic electroluminescence light-emitting portion.

16. The method according to claim 4, wherein the predetermined voltage of the auxiliary signal is one of a plurality of predetermined voltages, a first predetermined voltage of the auxiliary signal being set lower than the value of the video signal in a white display state, a second predetermined voltage of the auxiliary signal being set higher than the value of the video signal in a black display state.

* * * * *